US008860648B2

(12) United States Patent
Lee et al.

(10) Patent No.: US 8,860,648 B2
(45) Date of Patent: Oct. 14, 2014

(54) DRIVING CIRCUIT WITH IMPROVED STABILITY AT HIGH-TEMPERATURE CONDITIONS

(75) Inventors: Jaehoon Lee, Seoul (KR); Seunghwan Moon, Asan-si (KR)

(73) Assignee: Samsung Display Co., Ltd. (KR)

( * ) Notice: Subject to any disclaimer, the term of this patent is extended or adjusted under 35 U.S.C. 154(b) by 762 days.

(21) Appl. No.: 12/847,990

(22) Filed: Jul. 30, 2010

(65) Prior Publication Data

US 2011/0069044 A1     Mar. 24, 2011

(30) Foreign Application Priority Data

Sep. 21, 2009   (KR) ........................ 10-2009-0089124

(51) Int. Cl.
| | |
|---|---|
| G09G 3/36 | (2006.01) |
| G06F 3/038 | (2013.01) |
| G09G 5/00 | (2006.01) |
| G11C 19/28 | (2006.01) |

(52) U.S. Cl.
CPC ...... *G09G 3/3677* (2013.01); *G09G 2310/0286* (2013.01); *G11C 19/28* (2013.01); *G09G 2320/041* (2013.01)
USPC .......................................... 345/100; 345/204

(58) Field of Classification Search
CPC ............................ G09G 3/3674; G09G 3/3677
USPC ............ 345/204, 98–100; 377/70, 72, 73, 75, 377/77, 78, 80, 81
See application file for complete search history.

(56) References Cited

U.S. PATENT DOCUMENTS

| | | | | |
|---|---|---|---|---|
| 7,486,269 | B2 * | 2/2009 | Moon ........................... | 345/100 |
| 7,696,974 | B2 * | 4/2010 | Moon et al. .................... | 345/100 |
| 7,880,503 | B2 * | 2/2011 | Kwon et al. ..................... | 326/83 |
| 7,911,436 | B2 * | 3/2011 | Lee et al. ....................... | 345/100 |
| 2005/0008114 | A1 | 1/2005 | Moon | |
| 2007/0296681 | A1 * | 12/2007 | Kim et al. ...................... | 345/100 |
| 2010/0013823 | A1 * | 1/2010 | Kwon et al. ................... | 345/214 |
| 2010/0134399 | A1 * | 6/2010 | Ki et al. ........................... | 345/94 |
| 2010/0277206 | A1 * | 11/2010 | Lee et al. ....................... | 327/108 |
| 2011/0157263 | A1 * | 6/2011 | Kim et al. ...................... | 345/698 |

FOREIGN PATENT DOCUMENTS

| | | |
|---|---|---|
| CN | 1941063 | 4/2007 |
| CN | 101064194 | 10/2007 |
| CN | 101122720 | 2/2008 |
| JP | 2006-024350 | 1/2006 |
| JP | 2007-011336 | 1/2007 |
| JP | 2007-114781 | 5/2007 |
| JP | 2008-058939 | 3/2008 |

(Continued)

*Primary Examiner* — Jonathan Horner
(74) *Attorney, Agent, or Firm* — Innovation Counsel LLP

(57) ABSTRACT

A driving circuit including a shift register is presented, as well as a display device incorporating the driving circuit. The shift register has multiple stages, at least of which includes a first output circuit that generates an output signal O(i) according to a potential at Node Q; a second output circuit that generates a carry signal Cr(i) according to the potential at the Node Q; a controller circuit that controls the potential at the Node Q and the output signal O(i); a first holding circuit that maintains the output signal and the carry signal at low voltage states in response to a Node A reaching a predetermined potential; and a second holding circuit that controls a potential at the Node A, the second holding circuit including a first transistor that lowers the potential at the Node A in response to the carry signal Cr(i).

25 Claims, 17 Drawing Sheets

(56) References Cited

FOREIGN PATENT DOCUMENTS

| | | |
|---|---|---|
| JP | 2009-054273 | 3/2009 |
| JP | 2010-262296 | 11/2010 |
| JP | 2012-242820 | 12/2012 |
| JP | 2013-142899 | 7/2013 |
| KR | 10-2007-0105001 A | 10/2007 |
| KR | 10-2008-0039026 A | 5/2008 |
| KR | 10-2008-0057601 A | 6/2008 |

* cited by examiner

DRIVING CIRCUIT WITH IMPROVED STABILITY AT HIGH-TEMPERATURE CONDITIONS

CROSS-REFERENCE TO RELATED APPLICATION(S)

This application claims the benefit of Korean Patent Application No. 10-2009-0089124 filed on Sep. 21, 2009, the content of which is herein incorporated by reference in its entirety.

FIELD OF INVENTION

The present invention relates generally to a driving circuit and more particularly to a driving circuit capable of operating stably under extreme temperatures.

BACKGROUND

Recently, liquid crystal displays (LCDs) have become one of the more popular flat panel displays that can be used as television and computer monitors, personal digital assistants (PDAs), and mobile phones, among other applications. As research for improvements to LCDs continues, various new ways of manufacturing LCD devices have been pioneered. For example, while the driving circuitry and the LCD panel were traditionally two separate layers that are attached together, gate driving circuit may now be directly formed on the LCD panel through a thin film process.

In the devices where the gate driving circuit is formed on the LCD panel using a thin film process, the gate driving circuit includes a shift register in which a plurality of stages are connected with each other in a cascade configuration. Each stage includes a plurality of transistors connected with one another to output gate voltages to the proper gate lines. While the output gate voltages function properly under normal conditions, some malfunctioning occurs when temperatures increases, causing a leakage current in the main transistor.

For the LCD device to function properly, the main transistor is to remain turned off during the duration that it is designed to remain in the OFF state, regardless of temperature. Hence, a method of keeping the main transistor in the OFF state even under extreme temperature conditions is desired.

SUMMARY

In one aspect, the invention is a driving circuit including a shift register, wherein the shift register has multiple stages, at least one of which is a stage SRC(i) that includes: a first output circuit that generates an output signal O(i) according to a potential at Node Q; a second output circuit that generates a carry signal Cr(i) according to the potential at the Node Q; a controller circuit that controls the potential at the Node Q and the output signal O(i); a first holding circuit that maintains the output signal and the carry signal at low voltage states in response to a Node A reaching a predetermined potential; and a second holding circuit that controls a potential at the Node A, the second holding circuit including a first transistor that lowers the potential at the Node A in response to the carry signal Cr(i).

In yet another aspect, the invention is a display apparatus that includes a display panel including gate lines and data lines; a gate driver circuit including a shift register that has multiple stages, and a data driver chip outputting data voltages to the data lines. At least one of the stages in the shift register has: a first circuit that generates an output signal O(i) and transmits it to one of the gate lines according to a potential at Node Q; a second circuit that generates a carry signal Cr(i) according to the potential at the Node Q; a controller circuit that controls the potential at the Node Q and the output signal O(i); a first holding circuit that maintains the output signal and the carry signal at low voltage states in response to a high potential at Node A; and a second holding circuit that controls the potential at the Node A, the second holding circuit including a first transistor that lowers the potential at the Node A in response to the carry signal Cr(i).

DETAILED DESCRIPTION

As used herein, a transistor will be described as having a "first terminal," a "second terminal," and a "control terminal" that turns the transistor on and off, such that current flows between the first and second terminals when the transistor is on. Although different terms may be used in other papers for these parts of a transistor, a person of ordinary skill in the art will understand what is meant by each of these terms based on the context and the circuit diagrams in this disclosure.

Figure 1:
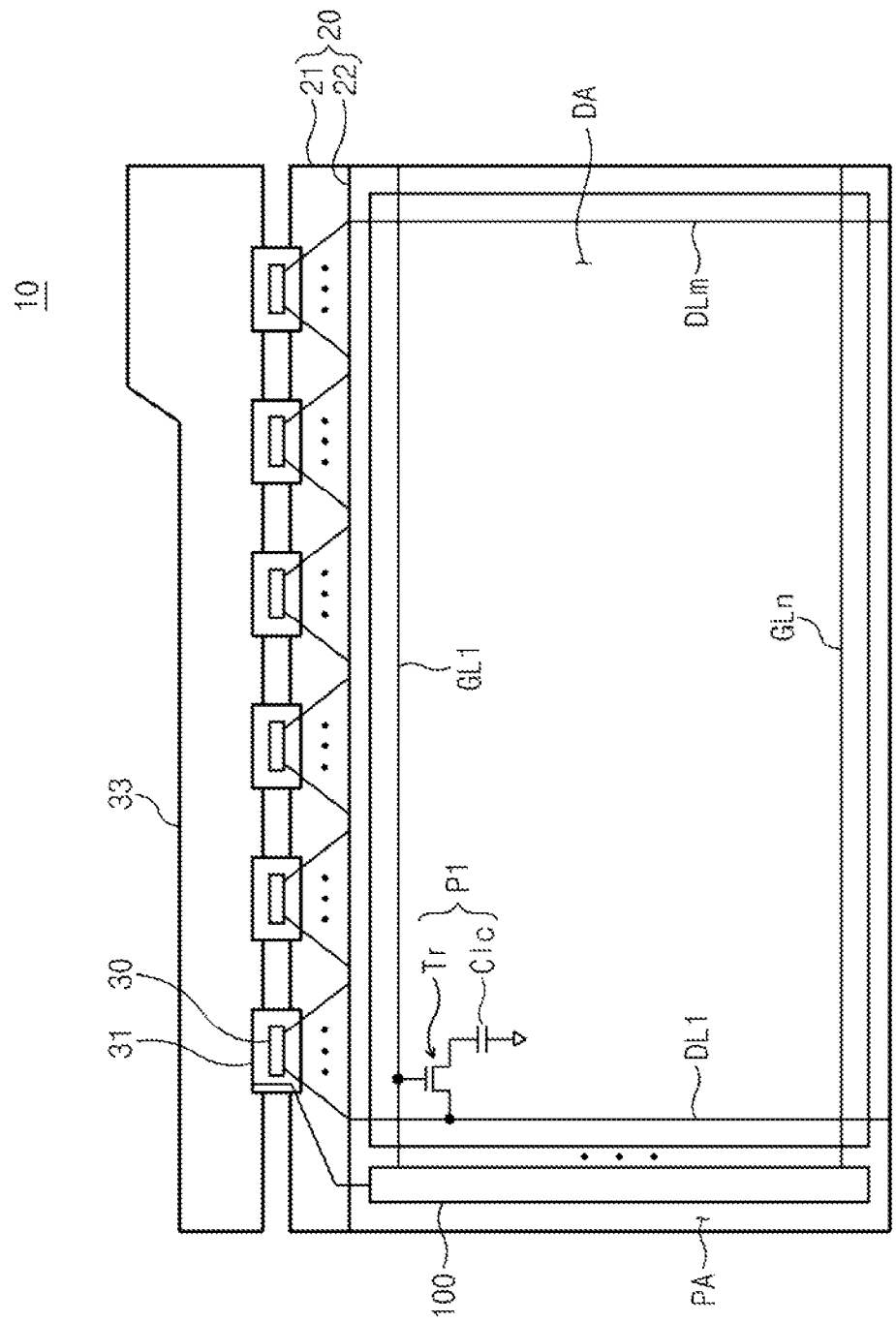
FIG. 1 shows a display apparatus according to an embodiment of the invention.

FIG. 1 shows a display apparatus 10 according to an embodiment of the invention. The display apparatus 10 includes an LCD panel 20, which has a first substrate 21, a second substrate 22, and a liquid crystal layer (not shown)

interposed between the first and second substrates 21, 22. The liquid crystal display panel 20 has a display area DA that displays images and a peripheral area PA next to the display area DA.

On the LCD panel 20 are data driving chips 30 outputting data voltage to the data lines DL1 . . . DLm, and a gate driving circuit 100 outputting a gate voltage to the gate lines GL1 . . . GLn. The data lines DL1 . . . DLm and the gate lines GL1 . . . GLn extend substantially perpendicularly to each other but are electrically insulated from each other. The gate lines GL1 . . . GLn and data lines DL1 . . . DLm define pixels in the display area DA. Each pixel includes a thin film transistor Tr and a liquid crystal capacitor Clc. The thin film transistor Tr has its gate electrode electrically connected with a gate line GLi (i being any integer between 1 and n, inclusive), its source electrode electrically connected with a data line DLj (j being any integer between 1 and m, inclusive), and its drain electrode electrically connected to a pixel electrode. The pixel electrode is one of the electrodes that make up the liquid crystal capacitor Clc.

The gate driving circuit 100 is provided in the peripheral area PA and is adjacent to one end of the gate lines GL1 . . . GLn. Typically, the gate driving circuit sequentially provides gate signals to the gate lines GL1 to GLn. The gate driving circuit 100 is formed directly on the peripheral area PA of the first substrate 21 through a thin film process, which is also used to form the pixels on the first substrate 21. Integrating the gate driving circuit 100 with the first substrate 21 as in this embodiment eliminates the need for driving chips in which the gate driving circuit 100 is usually embedded. Hence, the overall size of the display apparatus 10 may be reduced.

A plurality of tape carrier packages (TCPs) 31 are attached to the peripheral area PA adjacent to one end of the data lines DL1 . . . DLm. The data driving chips 30 are mounted on the TCPs 31. The data driving chips 30 are electrically connected to the ends of the data lines DL1 to DLm to output data voltages to the data lines DL1 . . . DLm.

The display apparatus 10 further includes a printed circuit board 33 to control the operations of the gate driving circuit 100 and the data driving chips 30. The printed circuit board 33 outputs data control signals, which are used to control the driving of the data driving chips 32 and image data. The printed circuit board 33 outputs a gate control signal used to control the driving of the gate driving circuit 100. The data driving chips 30 receive the image data in synchronization with the data control signal to convert the image data into data voltage and to output the data voltage. The gate driving circuit 100 receives the gate control signal through the TCP 31 and sequentially outputs the gate signals in response to the gate control signal. The liquid crystal display panel 20 charges the liquid crystal capacitor Clc with the data voltage in response to the gate signal such that the transmittance of the liquid crystal layer is adjusted, thereby displaying a desired image.

Figure 2:
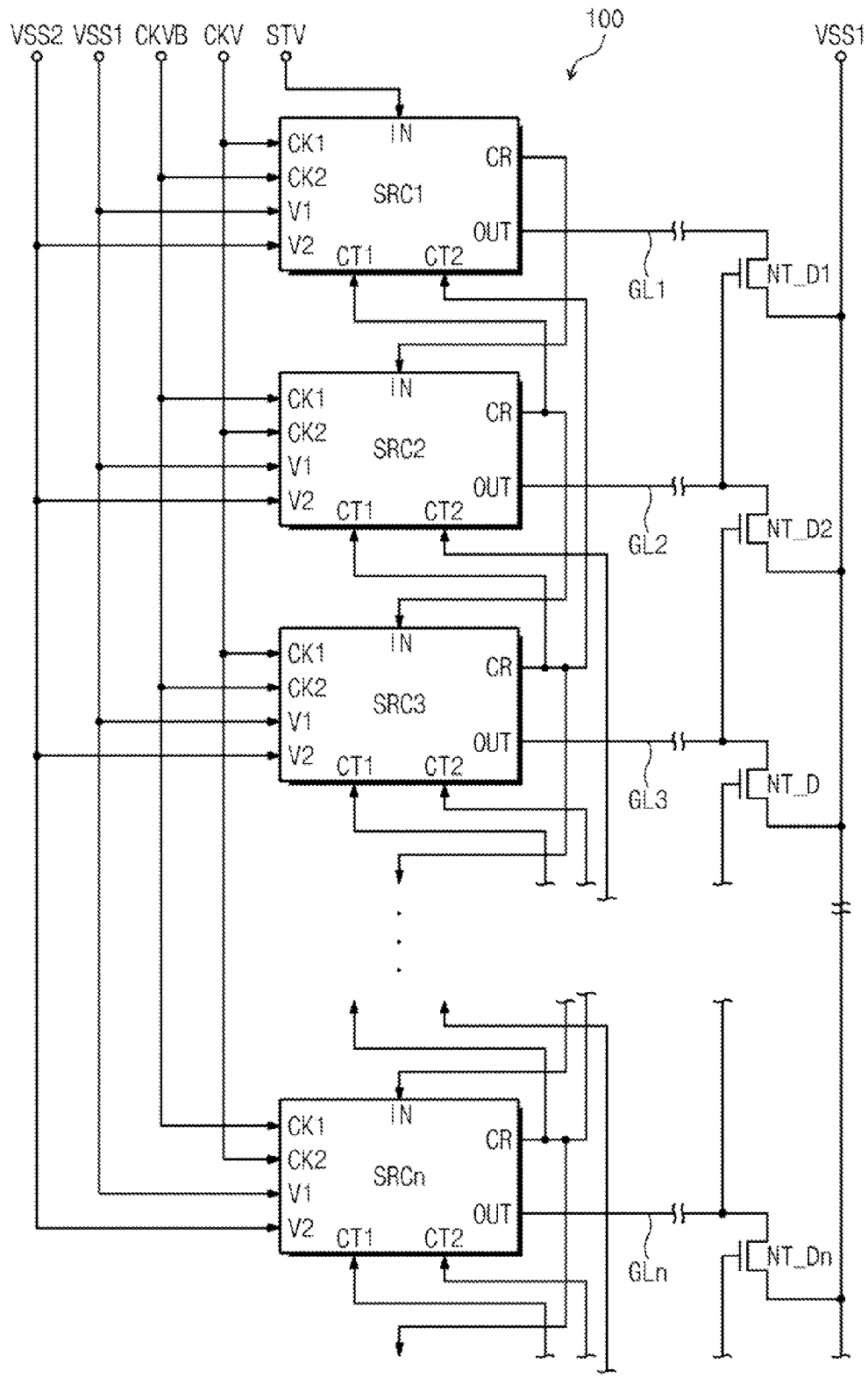
FIG. 2 is a block diagram showing a gate driving circuit according to an exemplary embodiment of the invention.

FIG. 2 is a block diagram showing the gate driving circuit 100 according to an exemplary embodiment of the invention. As shown, the gate driving circuit 100 includes a shift register having a plurality of stages SRC 1 . . . SRCn connected with one other. Each of the stages SRC1 to SRCn is connected to one of the gate lines GL1 . . . GLn. Each stage SRCi (wherein i is any one integer between 1 and n, inclusive) has an input terminal IN, a first clock terminal CK1, a second clock terminal CK2, a first voltage input terminal V1, a second voltage input terminal V2, a first control terminal CT1, a second control terminal CT2, an output terminal OUT, and a carry terminal CR.

The input terminal IN of the stage SRCi is electrically connected with the carry terminal CR of a previous stage (i−1) and receives a carry signal from the stage (i−1) (the carry signal from stage i−1 is herein referred to as Cr(i−1)). As for the first stage SRC1, which has no previous stage, its input terminal IN receives a starting signal STV to start the operation of the gate driving circuit 100.

The first control terminal CT1 of a stage SRCi receives the carry terminal CR from a next stage (i+1). The first clock terminals CK1 of the odd-numbered stages SRC1, SRC3, . . . receive a clock signal CKV, and the second clock terminals CK2 of the odd-numbered stages SRC1, SRC3, SRCn−1 receive a clock bar signal CKVB having a reverse phase with respect to the clock signal CKV. The first clock terminal CK1 of even-numbered stages SRC2, SRC4, . . . receive the clock bar signal CKVB, and the second clock terminal CK2 of the even-numbered stages SRC2, SRC4, . . . receive the clock signal CKV.

The first voltage input terminals V1 of the stages SRC1 SRCn receive a first voltage Vss1, and the second voltage input terminal V2 receive a second voltage Vss2 that is lower than the first voltage Vss1. The first voltage Vss1 may be a ground voltage level or a negative voltage level. In one embodiment, the first voltage Vss1 may be about −6 V, and the second voltage Vss2 may be about −12 V.

The output terminal OUT(i) is connected to a corresponding gate line GL(i) and supplies a gate signal.

The carry terminal CR(i) is electrically connected to the input terminal of the next stage IN(i+1), the first control terminal of a previous stage CT1(i−1), and the second control terminal from two stages ago CT2(i−2). The carry terminal CR(1) of the first stage SRC1 is connected to the input terminal of the next stage IN(i+1) but no previous stage as there is no previous stage, and the carry terminal CR(2) of the second stage SRC2 is connected to IN(3) and CT1(1).

Discharge transistors NT_D are connected to the gate lines GL1 to GLn. Each discharge transistor NT_D(i) includes a control terminal connected to a next gate line GL(i+1). The input terminal of the discharge transistor NT_D(i) is coupled to the output terminal of the corresponding stage OUT(i), and the output terminal of the discharge transistor NT_D(i) is coupled to the first voltage Vss1. Hence, each discharge transistor NT_D(i) discharges a gate signal of the corresponding gate line GL(i) to the first voltage Vss1 in response to the gate signal from the next stage GL(i+1).

Figure 3:
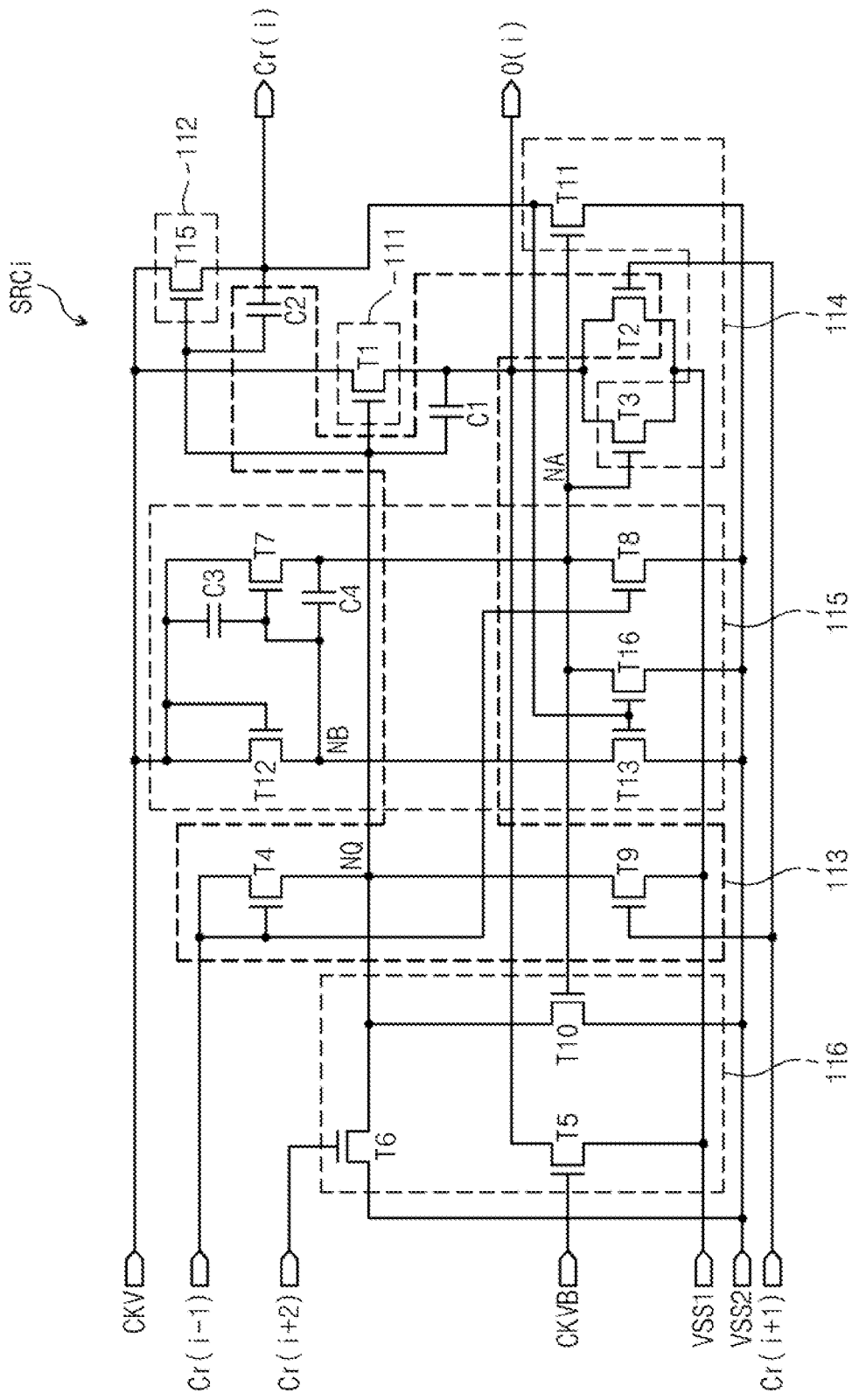
FIG. 3 is a circuit diagram showing an embodiment of one of the stages of a shift register in a driving circuit of the invention.

FIG. 3 is a circuit diagram showing an embodiment of one of the stages SRC(i). The stages SRC(1) to SRC(n) shown in FIG. 2 have substantially the same circuit configuration. As shown, the circuit in each stages SRC(i) includes 15 transistors of various sizes and four capacitors. Consistently with what is shown in FIG. 2, each stage SRC(i) has seven inputs and two outputs.

A first transistor T1, which is the main transistor of the driver circuit, is part of a first circuit 111. The first transistor T1 has an input terminal that receives the clock signal CKV, an output terminal that outputs the output signal O(i) (which may be a gate signal) to the gate line, and a control terminal that is coupled to a Node Q (NQ). A fifteenth transistor T15, which is part of a second circuit 112, has an input terminal that also receives the clock signal CKV, an output terminal that outputs the carry signal for that stage Cr(i) that substantially has the same voltage level as the output signal O(i), and a control terminal that is also coupled to the Node Q. Capacitor C1 is connected between the control terminal and the second terminal of Transistor T1. Capacitor C2 is connected between the control terminal and the second terminal of the transistor T15.

Transistors T2, T4, T9 and the capacitor coupled to the carry signal Cr(i) make up a controller circuit 113 capable of controlling the operation of the first transistor T1 and the fifteenth transistor T15 Transistor T4 includes a first terminal and a control terminal that receive a carry signal Cr(i−1) from the transistor T15 of the previous stage SRC(i−1). A second terminal of T4 is connected to the control terminal of the first transistor T1 and the Node Q. When Cr(i−1) is high, transistor T4 allows Node Q to go high, turning on transistors T1 and T15 in preparation for when the clock signal CKV rises (CKV is low at i−1). Transistors T1 and T15 being turned on means the output signal O(i) and the carry signal Cr(i) will go high when clock signal CKV goes high in stage SRCi, feeding the first terminals of transistors T1 and T15. Hence, when clock signal CKV goes high, the potential at Node Q gets boot-strapped up higher by capacitive coupling of capacitors C1 and C2. This boot-strapping of Node Q maintains the transistors T1 and T15 in a turned-on state, and the output signal O(i) and the carry signal Cr(i) remain high while the clock signal CKV is high.

Transistor T2 has a first terminal connected with the second terminal of the first transistor T1, a control terminal receiving the carry signal Cr(i+1) from the next stage, and a second terminal connected to the first voltage Vss1. Hence, in response to the carry signal from the next stage Cr(i+1), transistor T2 pulls the output signal O(i) to Vss1. Transistor T9 has a first terminal connected to Node Q, a control terminal receiving the carry signal Cr(i+1) from the next stage, and a second terminal connected to the first voltage Vss1. Hence, when Cr(i+1) goes high, transistors T9 and T2 pull down the output signal O(i) and Node Q down to Vss1, respectively.

In other words, transistor T2 brings the output signal O(i) down to the first voltage Vss1 when the clock signal CKV goes back down at (i+1), in response to carry signal Cr(i+1). Similarly, transistor T9 brings the potential at Node Q down to the first voltage Vss1 in response to the carry signal Cr(i+1). When the potential at Node Q goes down, the transistors T1 and T15 turn off. For transistors T1 and T15, Vgs is approximately at zero. However, as mentioned above, when the temperature goes up, a leakage current flows through the transistors. Hence, although the output signal O(i) should be high when the stage SRC(i) is active and remain low for the rest of the frame (e.g., i+1), this may not be the case under high-temperature conditions. To bring Vgs to below zero and reduce or eliminate current leakage even under high temperature conditions, the second voltage Vss2 is provided.

Transistors T3 and T11 together make up a first holding circuit 114. The control terminals of both transistors T3 and T11 are connected to Node A (NA), which in turn is controlled by a second holding circuit 115. In more detail, transistor T3 has a first terminal coupled to the second terminal of the transistor T1, a control terminal coupled to Node A, and a second terminal coupled to the first voltage Vss1. Transistor T11 has a first terminal coupled to the second terminal of the transistor T15, a control terminal coupled to Node A, and a second terminal coupled to the second voltage Vss2. Transistor T3 holds the output signal O(i) at the first voltage Vss1 while the first transistor T1 is turned off. Transistor T11 holds the carry signal Cr(i) at the second voltage Vss2 while Transistor T15 is turned off. When the clock signal CKV goes up at stage SRC(i+2), transistor T6 turns on in response to carry signal Cr(i+2), pulling Node Q down to Vss2 and bringing Vgs to a negative value for transistor T1.

Transistors T7, T8, T12, T13, T16 and capacitors C3 and C4 make up a second holding circuit 115 capable of controlling transistors T3 and T11 via Node A. The second holding circuit 115 includes a sub-circuit, which includes T12, T7, C3, and C4. Transistor 16 has a first terminal coupled to Node A, a control terminal that receives the carry signal Cr(i), and a second terminal coupled to the second voltage Vss2. Transistor T8 has a first terminal coupled to the control terminal of transistor T3, a control terminal receiving the carry signal Cr(i−1), and a second terminal coupled to the second voltage Vss2. Transistor T13 has a first terminal coupled to Node B, a control terminal receiving the carry signal Cr(i), and a second terminal coupled to the second voltage Vss2. Transistor T12 has a first terminal and a control terminal receiving the clock signal CKV and a second terminal coupled to Node B. Transistor T7 has a first terminal receiving the clock signal CKV, a control terminal coupled to Node B and a second terminal coupled to Node A. The capacitor C3 is connected between the first and control terminals of the transistor T7, and the capacitor C4 is connected between the second terminal of the transistor T12 and the second terminal of the transistor T7.

The transistor T16 supplies the second voltage Vss2 to Node A in response to the carry signal Cr(i). Hence, transistor T16 ensures that the first holding circuit 114 does not pull the output signal O(i) or the carry signal Cr(i) to a low state while Cr(i) is high. Transistor T8 supplies the second voltage Vss2 to Node A in response to the carry signal Cr(i−1). Hence, while stage SRC(i−1) is active, T3 and T11 are turned off by transistor T8, allowing the output signal O(i) to precharge at (i−1).

Transistor T13 is turned on in response to the carry signal Cr(i) such that the clock signal CKV output from transistor T12, which is turned on while the clock signal CKV is high, is lowered to the second voltage Vss2 by the transistor T13. Accordingly, the clock signal CKV is stopped from reaching Node A via T7, and Node A remains low while Cr(i) is high. This way, the bootstrapping operation at T1 is performed normally.

When the clock signal CKV goes high, the capacitors C3 and C4 charge and transistor T7 turns on. Thereafter, if transistors T16, T13, and T8 are turned off while transistor T7 is turned on, the potential at Node A increases. When the potential at Node A goes up, transistors T3 and T11 turn on. When turned on, transistor T3 holds the output signal O(i) at the first voltage Vss1, and transistor T11 holds the carry signal Cr(i) at the second voltage Vss2. The second holding circuit 115 of each stage includes the transistor T16 to hold the potential at Node A at the second voltage Vss2 in response to the carry signal Cr(i), ensuring normal bootstrapping operation.

Transistors T6, T10, and T5 make up a stabilizing circuit 116 that stabilizes the potential at Node Q. Transistor T6 has a first terminal coupled to Node Q, a control terminal receiving a carry signal from two stages later Cr(i+2), and a second terminal coupled to the second voltage Vss2. Hence, when stage SRC(i+2) is active, transistor T6 ensures that transistor T1 is off by pulling its control terminal down to Vss2, thereby stabilizing Node Q. The transistor T10 has a first terminal coupled to Node Q, a control terminal coupled to Node A, and a second terminal coupled to the second voltage Vss2. If the potential at Node A is pulled down to the second voltage Vss2, transistor T10 turns off, and if the potential at Node A goes up due to the clock signal CKV rising, it turns on. Transistor T10 turning on lowers the potential at Node Q to the second voltage Vss2. Hence, the potential at Node Q is stabilized to the second voltage Vss2 by T6 at (i+1) (when the clock is low) and by T10 when the clock CKV is high and the carry signal Cr(i) is low (so that T16 is turned off). Transistor T5 has a first terminal coupled to the output signal O(i), a control terminal receiving the clock bar signal CKVB, and a second terminal coupled to the first voltage Vss1. Transistor T5 maintains the output signal O(i) at the first voltage Vss1 in response to the clock bar signal CKVB.

The stabilizing circuit 116 stabilizes the potential at Node Q, thereby reducing the leakage current at transistor T1 and preventing it from being turned on abnormally at high temperature conditions.

Figure 4:
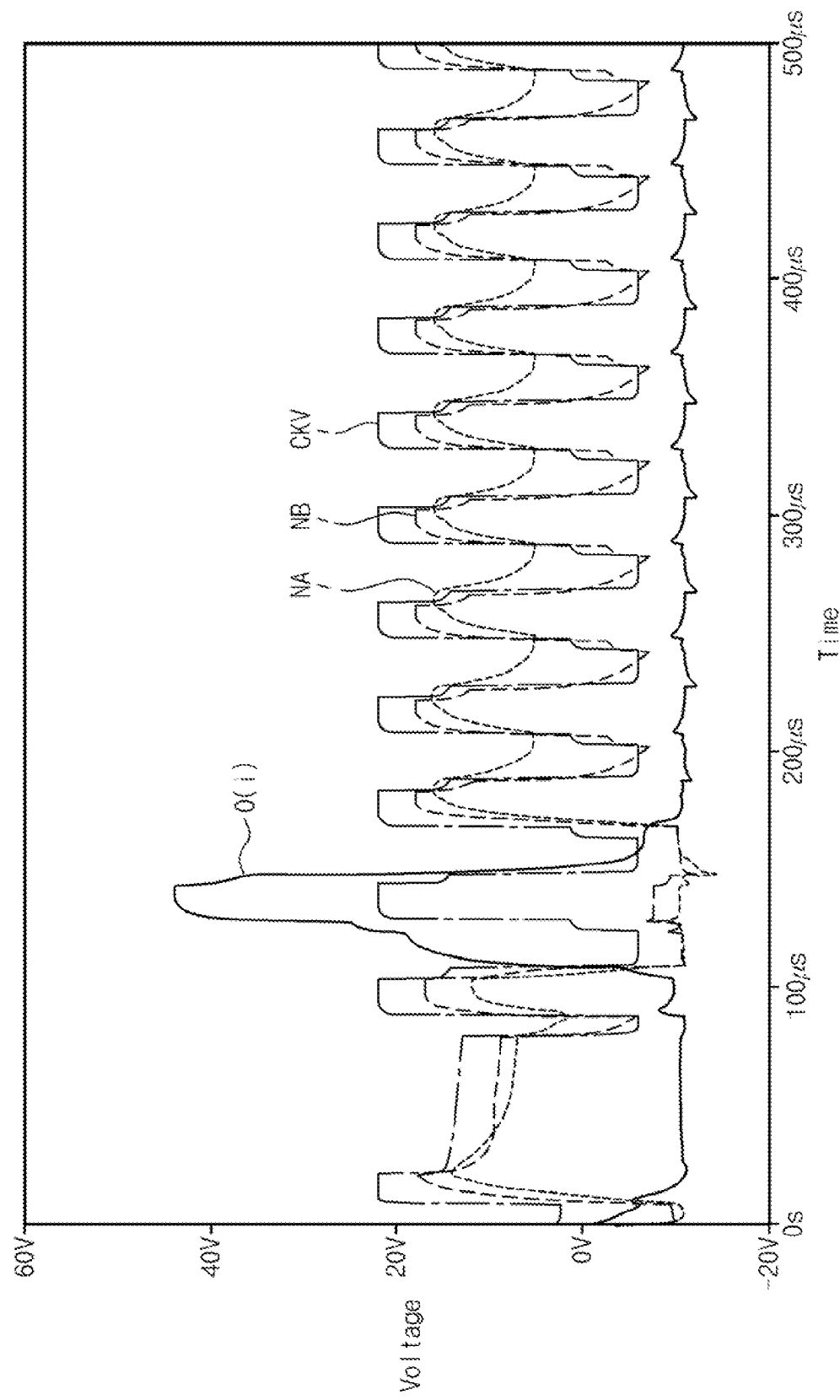
FIG. 4 is a waveform showing the output signal of a shift register stage shown in FIG. 2.

FIG. 4 is a waveform showing the output signal O(i) of stage SRC(i) shown in FIG. 2. In FIG. 4, a first graph represents the output signal O(i), a second graph represents the clock signal CLK, a third graph represents the potential at Node A and a fourth graph represents the potential at Node B.

When the second holding circuit 115 includes transistor T16 holding the potential at Node A at the second voltage Vss2 in response to the carry signal Cr(i), the potential at Node A is stabilized. This way, bootstrapping at transistor T1 can happen normally and output signal O(i) can be generated normally.

Figure 5:
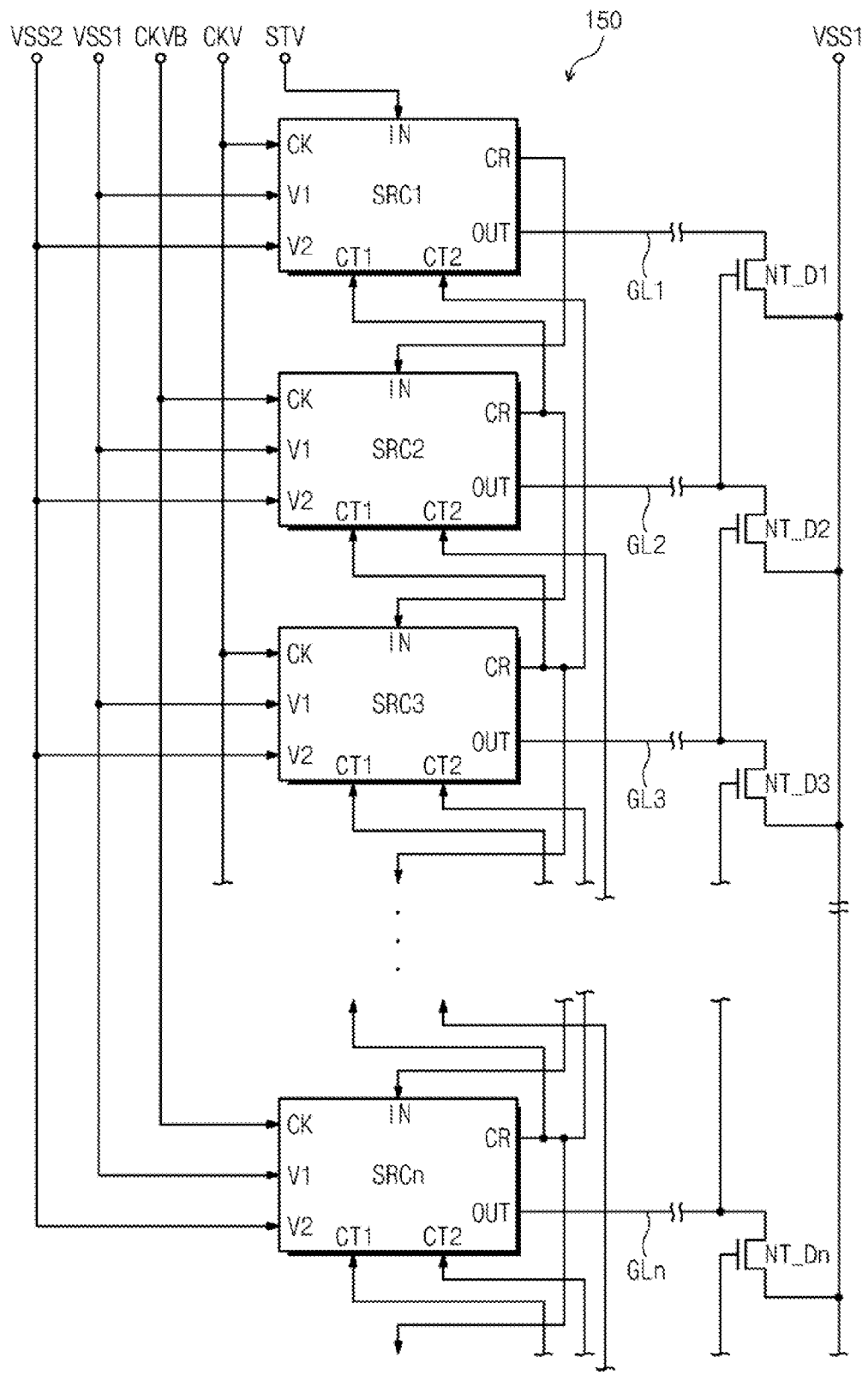
FIG. 5 is a block diagram showing a gate driving circuit according to another embodiment of the invention.

FIG. 5 is a block diagram showing a gate driving circuit 150 according to another embodiment of the invention. The gate driving circuit 150 has a substantially similar structure as that of the gate driving circuit 100 shown in FIG. 2, with a primary difference being that each stage SRC(i) has one clock terminal CK (instead of CK1 and CK2). The clock signal CKV is provided to the clock terminal CK of odd-numbered stages SRC(1), SRC(3), SRC(5) . . . The clock bar signal CKVB is provided to the clock terminal CK of even-numbered stages SRC(2), SRC(4), SRC(6), . . . .

Figure 6:
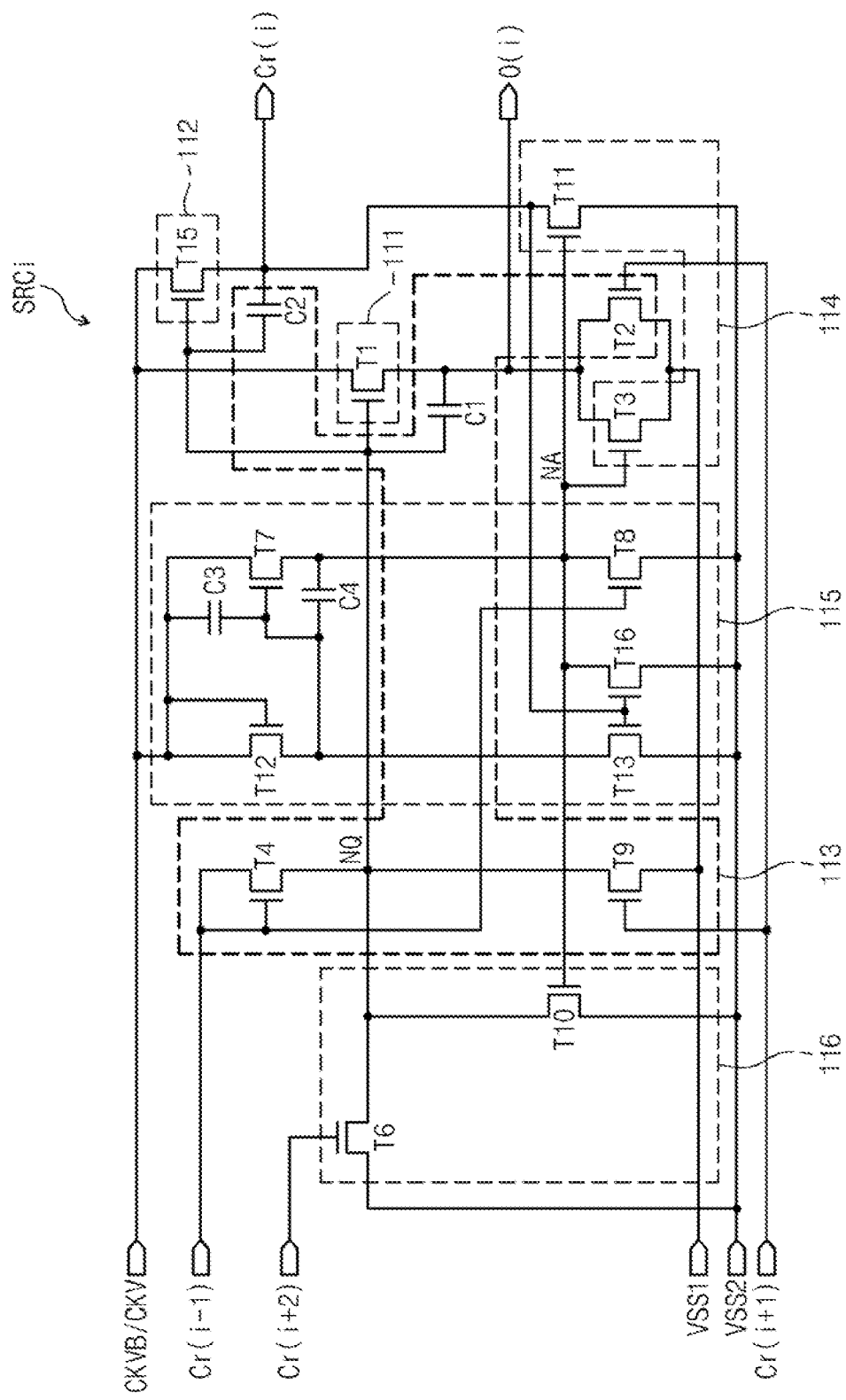
FIG. 6 is a circuit diagram showing a stage from the gate driving circuit of FIG. 5.

FIG. 6 is a circuit diagram showing a stage SRC(i) from the gate driving circuit 150 shown in FIG. 5. As shown, the circuit of the gate driving circuit 150 is substantially similar to that of FIG. 3 except that transistor T5 is removed.

If stage SRC(i) were an odd-numbered stage, clock signal CKV would be provided. On the other hand, if stage SRC(i) were an even-numbered stage, the clock bar signal CKVB would be provided to it.

Figure 7:
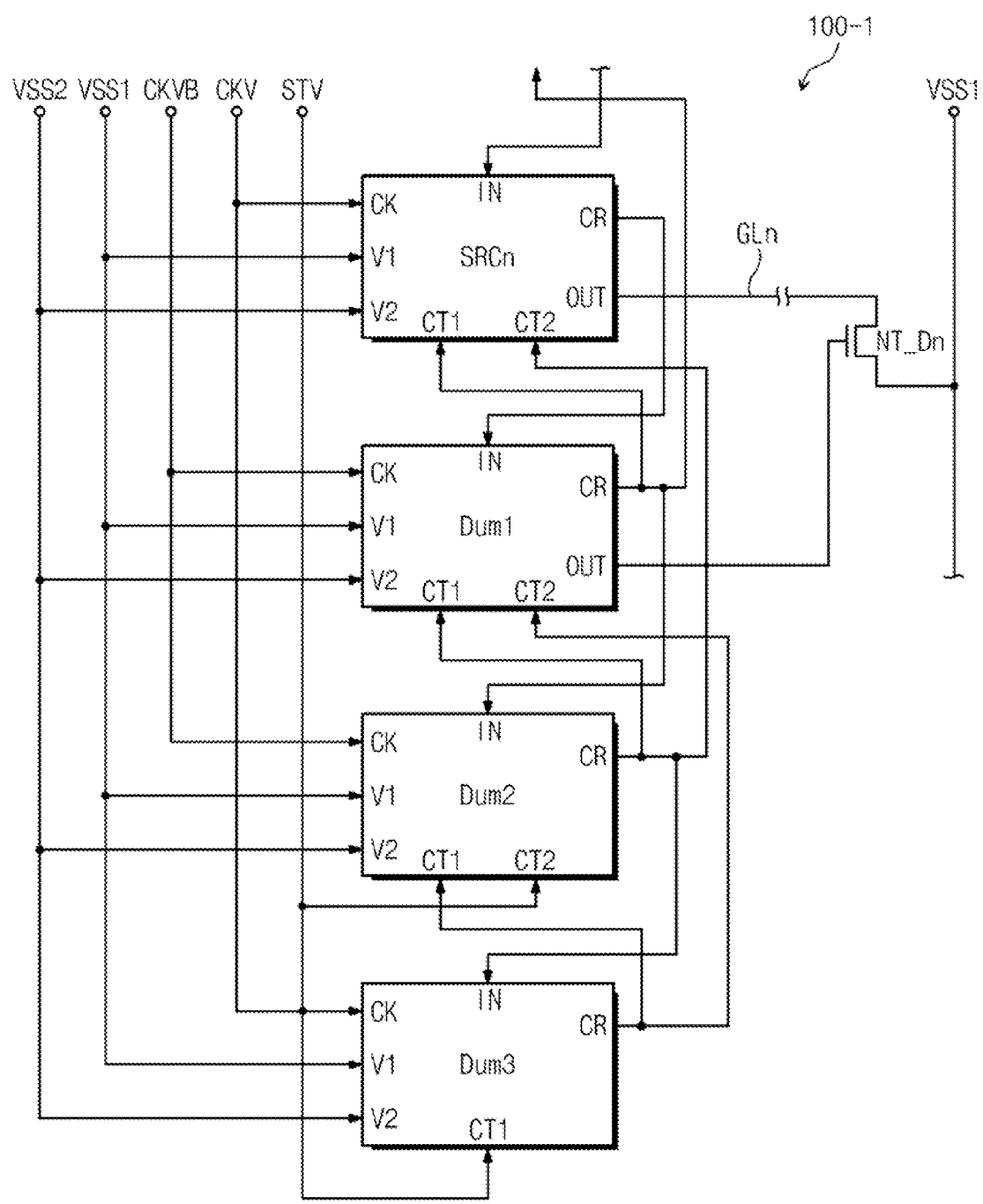
FIG. 7 is a block diagram showing a gate driving circuit according to yet another embodiment of the invention.

FIG. 7 is a block diagram showing a gate driving circuit according to yet another embodiment of the invention. A gate-driving circuit 100-1 includes a first dummy stage Dum1, a second dummy stage Dum2, and a third dummy stage Dum3 in addition to the non-dummy stages SRC1 . . . SRCn described above. The first dummy stage Dum1 outputs a first dummy signal Cr(n+1) from its carry terminal CR and a first dummy output signal O(n+1) in response to a carry signal Cr(n) from the previous stage SRCn.

The carry terminal CR of the first dummy stage Dum1 provides the first dummy signal Cr(n+1) to the first control terminal CT1 of the previous stage SRCn and the input terminal IN of the second dummy stage Dum2. Although not shown in the figures, the carry terminal CR of the first dummy stage Dum1 may also be connected to the second control terminal CT2 of the stage SRC(n−1) to provide the first dummy signal Cr(n+1).

The output terminal OUT of the first dummy stage Dum1 is coupled to a control terminal of a last discharge transistor NT_D(n) that has a first terminal coupled to a last gate line GLn. The last discharge transistor NT_D(n) is turned on in response to the first dummy signal Cr(n+1) output through the output terminal OUT of the first dummy stage Dum1, so that the turned-on last discharge transistor NT_D brings down the potential at the last gate line GLn to the first voltage Vss1. The second dummy stage Dum2 outputs a second dummy signal Cr(n+2) through its carry terminal CR in response to the first dummy signal Cr(n+1).

The carry terminal CR of the second dummy stage Dum2 provides the second dummy signal Cr(n+2) to the second control terminal CT2 of the stage SRCn, the first control terminal CT1 of the first dummy stage Dum1, and the input terminal IN of the third dummy stage Dum3. This way, the first and second control terminals CT1 and CT2 of the nth stage SRCn receive the first and second dummy signals Cr(n+1) and Cr(n+2) from the first and second dummy stages Dum1, Dum2, respectively, and provide an output signal (e.g., a gate signal) to the last gate line GLn. The third dummy stage Dum3 outputs a third dummy signal Cr(n+3) in response to the second dummy signal Cr(n+2).

The carry terminal CR of the third dummy stage Dum3 provides the third dummy signal Cr(n+3) to the second terminal CT2 of the first dummy stage Dum1 and the first control terminal CT1 of the second dummy stage Dum2. The second control terminal CT2 of the second dummy stage Dum2 receives a starting signal STV, which is also provided to the input terminal IN of the first stage SRC1. In addition, the starting signal STV may be provided to the first control terminal CT1 of the third dummy stage Dum3.

As no gate signal comes out of the dummy stages, the second dummy stage Dum2 and the third dummy stage Dum3 have no signal coming out of the output terminal OUT.

The third dummy stage Dum3 is different from the first and second dummy stages Dum1 and Dum2 in that it does not include the second control terminal CT2. Details of the third dummy stage Dum3 will be describe below, in reference to FIG. 11.

Figure 8:
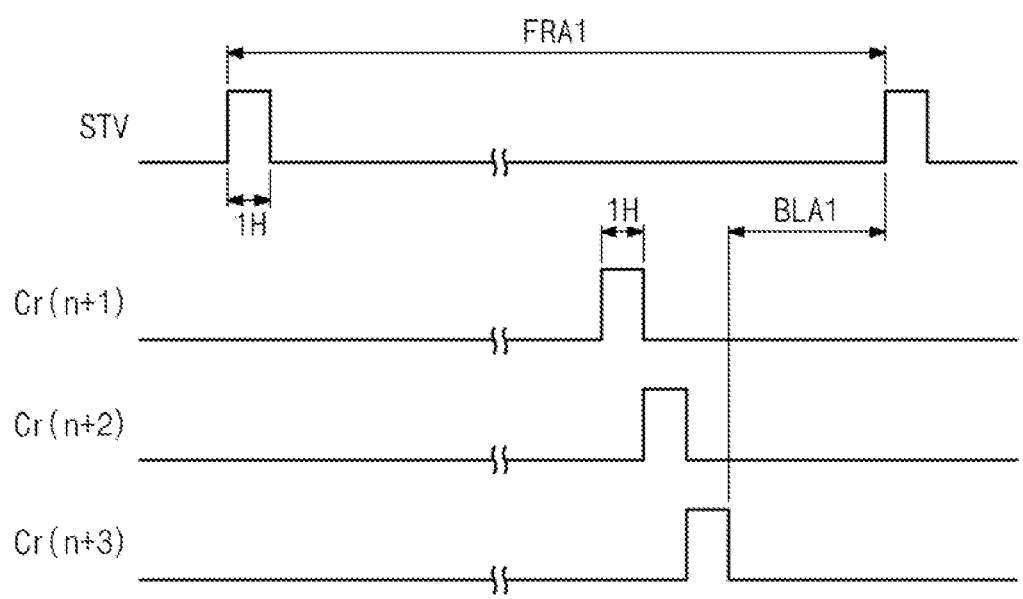
FIG. 8 is a waveform showing a starting signal STV, a first dummy signal Cr(n+1), a second dummy signal Cr(n+2), and a third dummy signal Cr(n+3).

FIG. 8 is a waveform showing a starting signal STV, a first dummy signal Cr(n+1), a second dummy signal Cr(n+2), and a third dummy signal Cr(n+3). The starting signal STV is for a duration of 1 H during a frame period FRA1. The frame period FRA1 includes a period 1 H for each of the stages SRC1 through SRCn (not shown) and the dummy stages n+1, n+2, and n+3, as well as a blank duration BLA1 during which the data voltages are applied to the data lines DL1 to DLm.

The first, second, and third dummy signals Cr(n+1), Cr(n+2), and Cr(n+3) are sequentially generated, and each maintained at a high state for a duration of 1 H. As shown in FIG. 8, the first, second, and third dummy signals Cr(n+1), Cr(n+2), and Cr(n+3) are used to control operations of adjacent stages. However, as shown in FIG. 8, the starting signal STV of a next frame is generated after the dummy signal Cr(n+3) of a current frame (and the blank period BLA1). Hence, the starting signal STV of the next frame may be used to control the operation of the second and third dummy stages Dum2 and Dum3 of the next frame.

Figure 9:
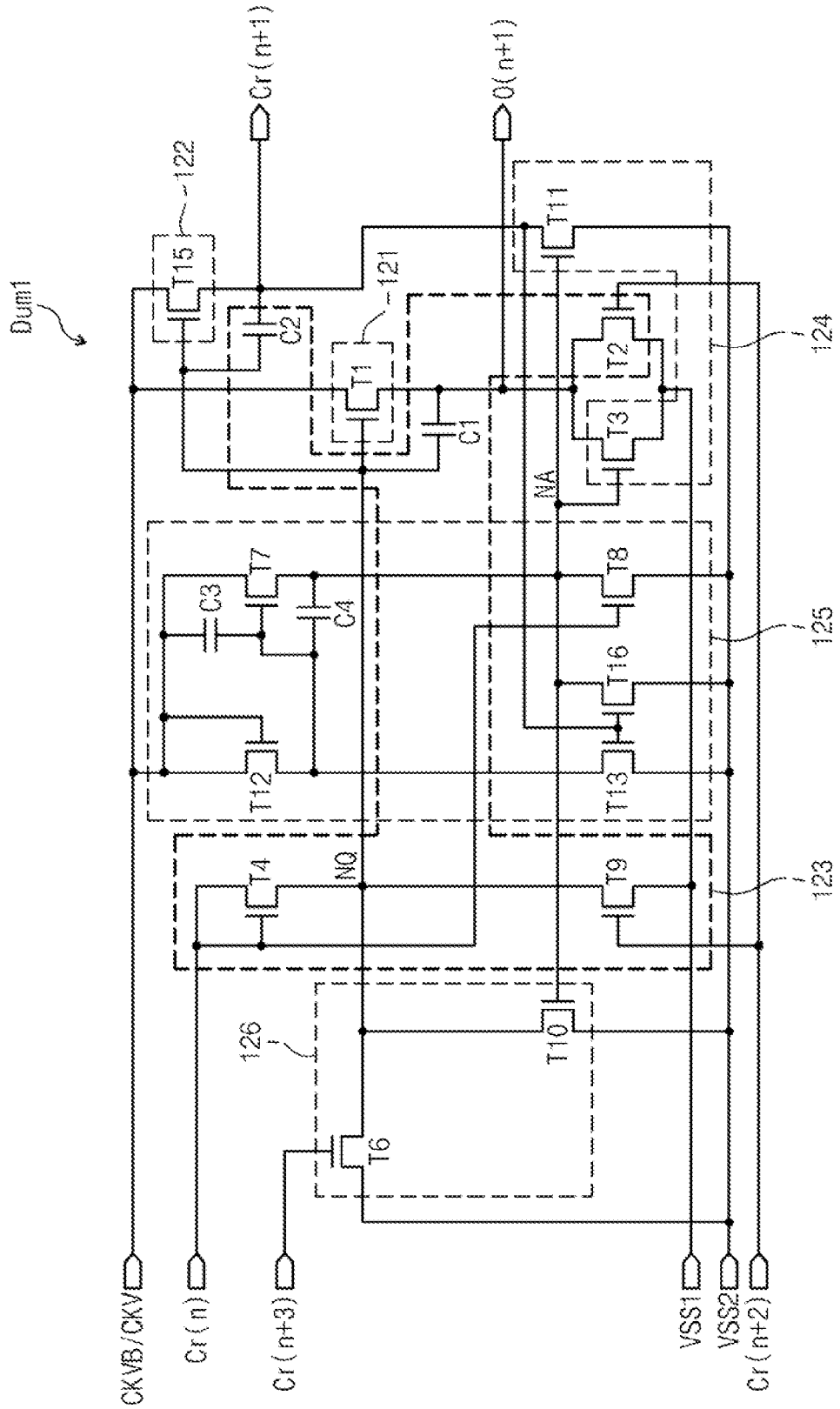
FIG. 9 is a circuit diagram showing the first dummy stage of FIG. 7.

FIG. 9 is a circuit diagram showing the first dummy stage of FIG. 7. As shown, the first dummy stage Dum1 includes substantially the same set of transistors as the stage SRCi shown in FIG. 3. The transistor T15 outputs the first dummy signal Cr(n+1) to the first control terminal CT1 of the stage SRCn. The first circuit 121, which includes transistor T1, outputs the output signal O(n+1), which reaches the control terminal of the discharge transistor NT_D as shown in FIG. 7.

The first dummy control circuit 123 controls the operations of the first and fifteenth transistors T1, T15 in response to a second dummy control signal Cr(n+2) and a third dummy control signal Cr(n+3).

The first dummy holding part 124 holds the first dummy signal Cr(n+1) at the first voltage Vss1 during a turn-off duration of the first transistor T1. The second dummy holding circuit 125 provides the second voltage Vss2 to the first dummy holding part 124 in response to the first dummy signal Cr(n+1) from the fifteenth transistor 122 during a turn-on duration of the first transistor T1, so that the first dummy holding circuit 124 is turned off to Vss2.

Transistors 6 and 10 provide the second voltage Vss2 to the first and fifteenth transistors T1 and T15 in response to the third dummy signal Cr(n+3) and an output signal from the second dummy holding circuit 125 during the turn-off duration of the third output part 121, so that the first and fifteenth transistors T1 and T15 stay turned off at the second voltage Vss2. Transistors T12, T7 and capacitors C3, C4 make up a sub-circuit of the second dummy holding circuit 125.

Figure 10:
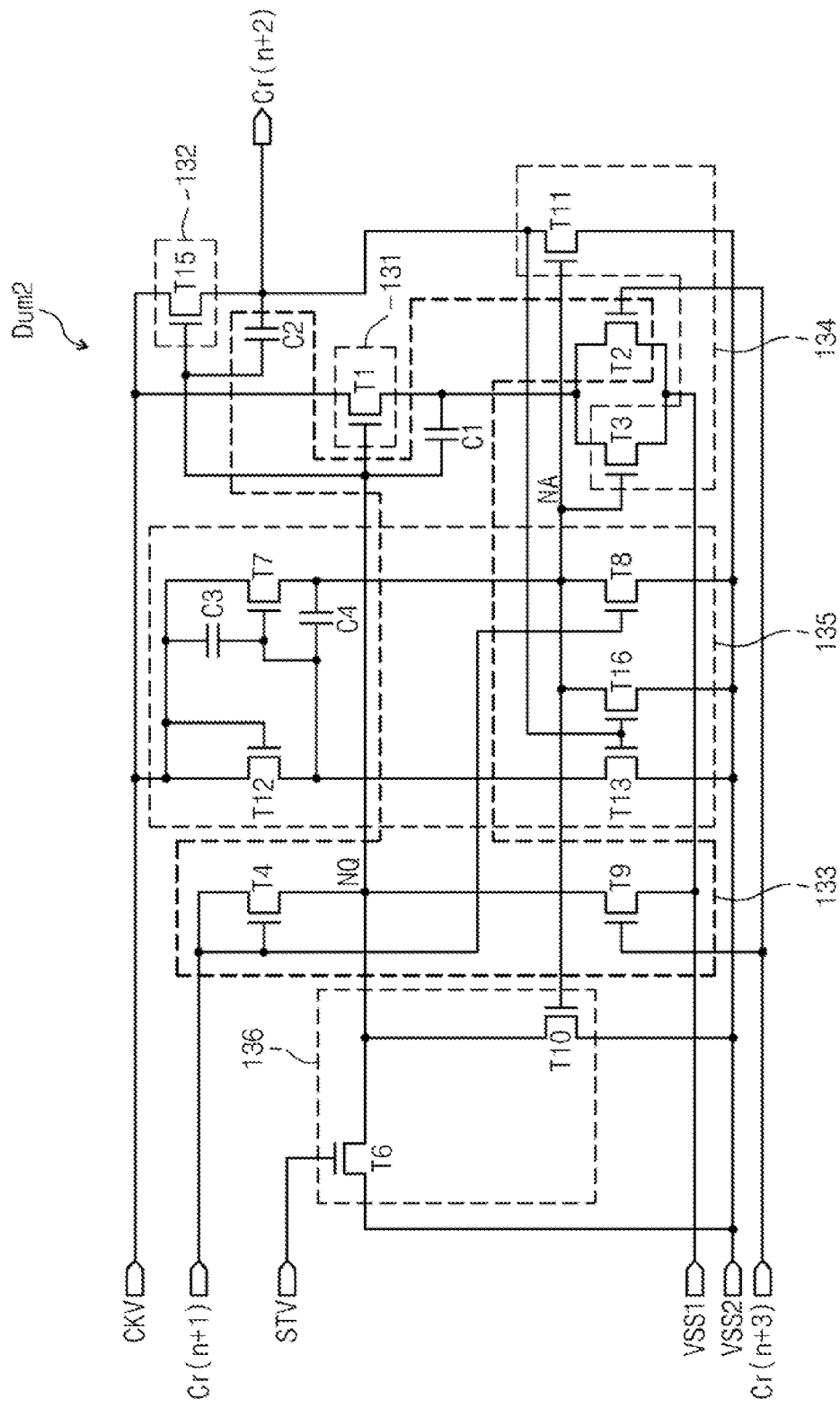
FIG. 10 is a circuit diagram of the second dummy stage Dum2 of FIG. 6.

FIG. 10 is a circuit diagram of the second dummy stage Dum2 of FIG. 6. The second dummy stage has substantially the same circuit configuration as the stage SRCi described above. The fifteenth transistor T15 outputs the second dummy signal Cr(n+2) to the first dummy stage Dum1 and the nth stage SRCn. The dummy controller 133 controls an operation of the first and fifteenth transistors T1, T15 in response to a dummy control signal Cr(n+3) and the starting signal STV.

The first dummy holding circuit 134 holds the second dummy signal O(n+2) from the first transistor T1 at the first voltage Vss1 during a turn-off duration of the transistor T1. The second dummy holding circuit 135 provides the second voltage Vss2 to the first dummy holding circuit 134 in response to the second dummy signal Cr(n+2) while the first transistor T1 is turned on, so that the first dummy holding part 134 is maintained in an off state at the second voltage Vss2. Transistors T12, T7 and capacitors C3, C4 make up a sub-circuit of the second dummy holding circuit 135.

Transistors T6 and T10 provide the second voltage Vss2 to the first transistor T1 and the fifteenth transistor T15 in response to the starting signal STV and an output signal of the second dummy inverter part 135 while the first transistor T1 is turned off. This way, the first and fifteenth transistors T1, T15 remain turned off by the second voltage Vss2.

Figure 11:
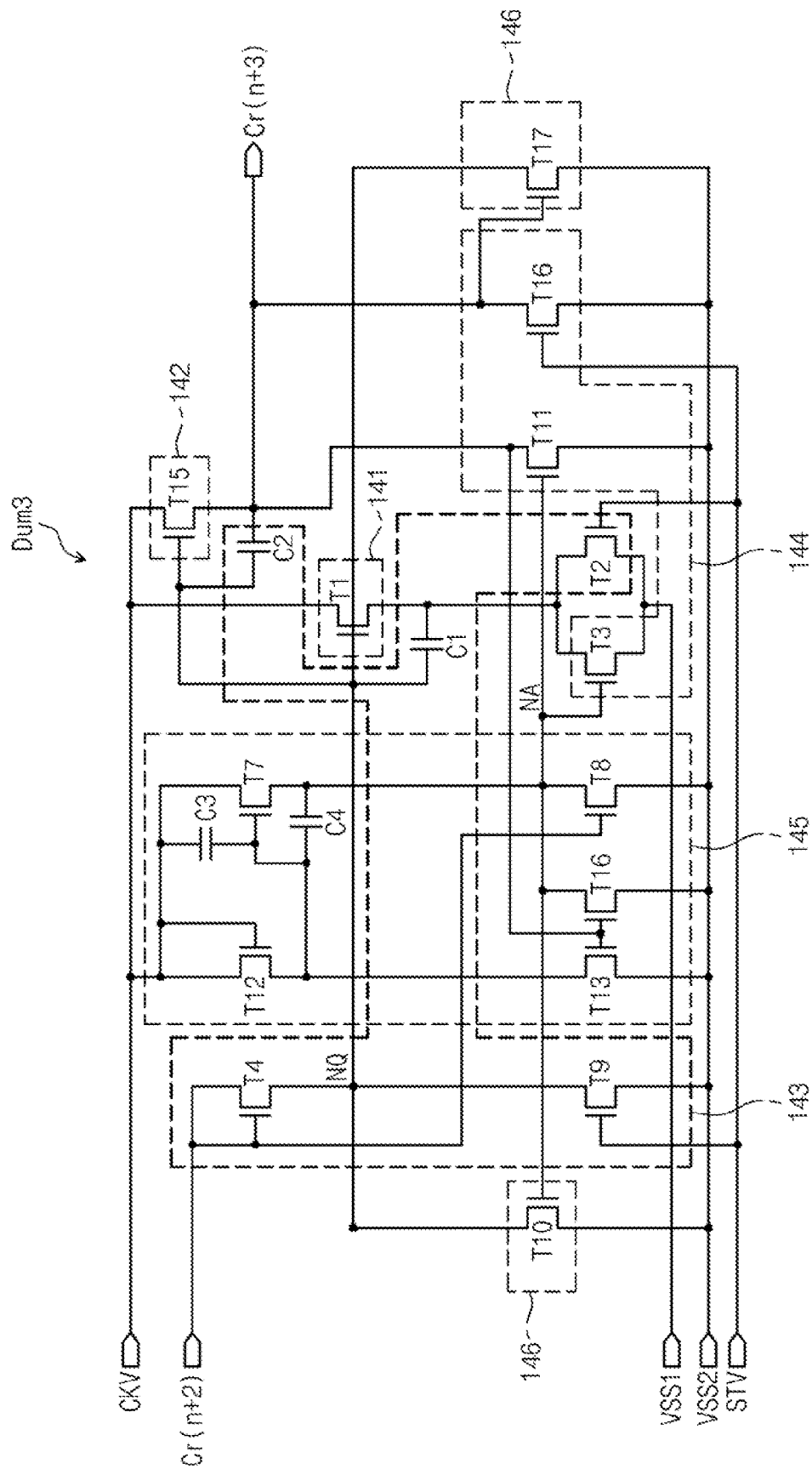
FIG. 11 is a circuit diagram of the third dummy stage Dum3 of FIG. 7.

FIG. 11 is a circuit diagram of the third dummy stage Dum3 of FIG. 7. Although the third dummy stage Dum3 has similar configuration as the first two dummy stages Dum1, Dum2, it differs in a few ways. Particularly, the sixth transistor T6 is absent in the third dummy stage Dum3. The fifteenth transistor T15 of the second circuit 142 outputs the third dummy signal Cr(n+3) to the second control terminal CT2 of the first dummy stage Dum1 and the first control terminal CT1 of the second dummy stage Dum2. Furthermore, the second terminal of the ninth transistor T9 is connected to the second voltage Vss2 instead of the first voltage Vss1 as in the other stages. This way, the potential at the node Q is stabilized at Vss2 lower than the first voltage Vss1. Accordingly, transistor T1 (of first circuit 141) and transistor T15 are prevented from turning on at high temperatures. Also, the third dummy stage Dum3 includes transistors T16 and T17, whose functions will be described in more detail below.

The dummy controller circuit 143 controls the operation of the first and fifteenth transistors T1, T15 in response to the starting signal STV.

The dummy holding part 144 includes transistor T3, transistor T11, and a transistor T16. Transistors T3 and T11 are connected in substantially the same manner as the first and second holding transistors T3 and T11 of FIG. 3. Accordingly, the first holding transistor T3 may hold the third dummy signal Cr(n+3) from the first transistor T1 at the first voltage Vss1 through capacitors C1 and C2 while the transistor T1 is turned off. Furthermore, the transistor T11 will pull the third dummy signal Cr(n+3) to the second voltage Vss2 when the second dummy holding circuit 145 charges up Node A, turning on the transistor T11.

Transistor T16, which was absent in other stages, is added to the third dummy stage Dum3. Transistor T16 includes a first terminal receiving the third dummy signal Cr(n+3) from transistor T15, a control terminal receiving the starting signal STV, and a second terminal connected to the second voltage Vss2. Accordingly, transistor T16 may hold the third dummy signal Cr(n+3) coming out of transistor T15 at the second voltage Vss2 in response to the starting signal STV.

The second dummy holding circuit 145 provides the second voltage Vss2 to the first dummy holding circuit 144 in response to the third dummy signal Cr(n+3) from the transistor T2 while the transistor T1 is turned on, so that the first dummy holding circuit 144 is turned off by the second voltage Vss2. The second dummy holding circuit 145 has a same structure as that of the second holding circuit 115 of FIG. 3. Transistors T12, T7 and capacitors C3, C4 make up a sub-circuit of the second dummy holding circuit 145.

A third dummy stabilizing part 146 includes transistor T10 and a new transistor T17. The third dummy stabilizing part 146 is different from the stabilizing part 116 shown in FIG. 3 in that the transistors T6 and T5 are removed and the transistor T17 is added. The transistor T17 includes a first terminal connected with the Node Q, a control terminal receiving the third dummy signal Cr(n+3), and a second terminal connected with the second voltage Vss2. Accordingly, the transistor T17 stabilizes the potential at the Node Q at the second voltage Vss2 in response to the third dummy signal Cr(n+3).

Figure 12:
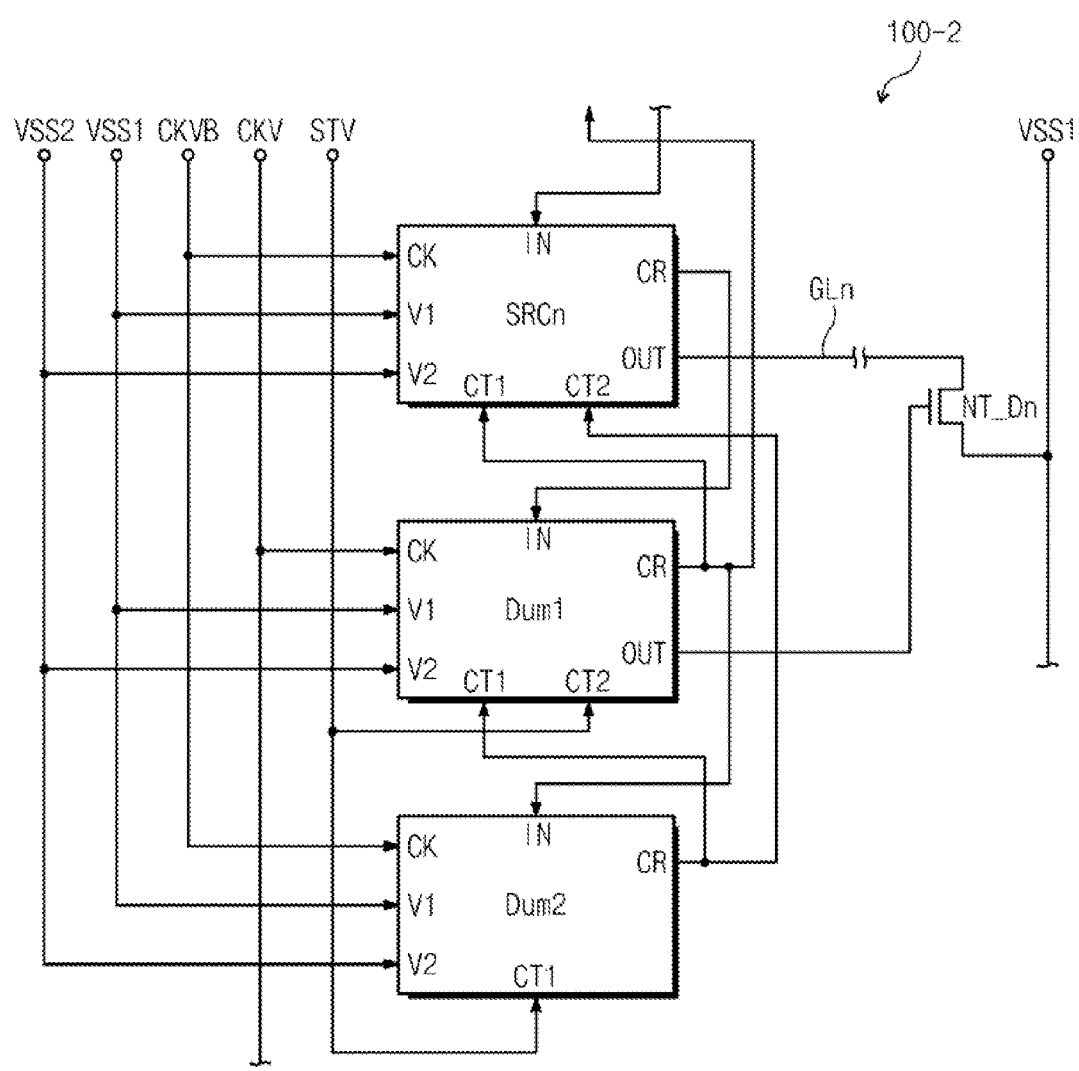
FIG. 12 is a block diagram showing a gate driving circuit according to another embodiment of the invention.
Figure 13:
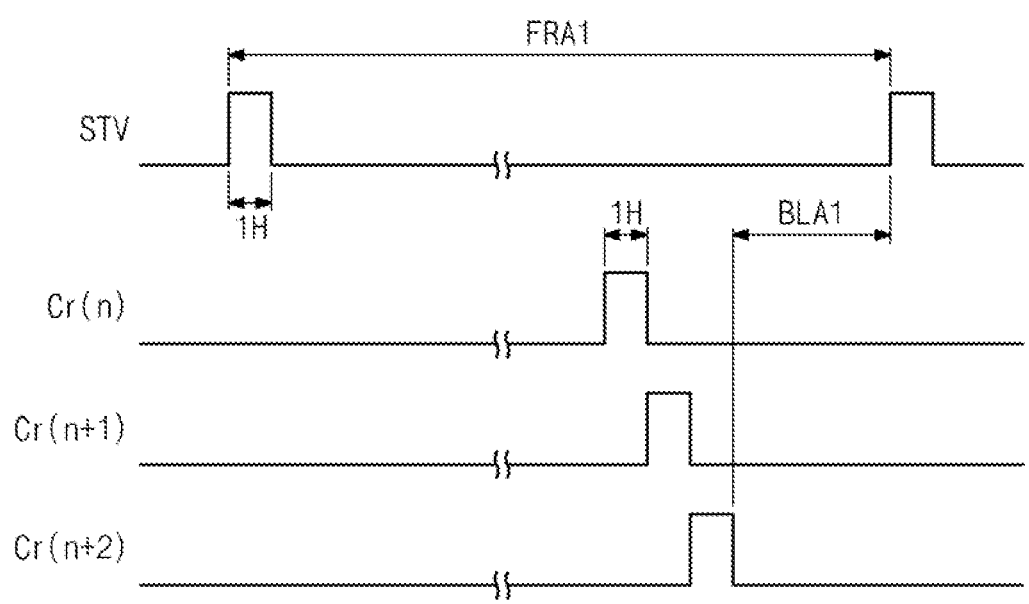
FIG. 13 is a waveform diagram showing a starting signal STV, a first dummy signal Cr(n+1), and a second dummy signal Cr(n+2).

FIG. 12 is a block diagram showing a gate driving circuit according to another embodiment of the invention, and FIG. 13 is a waveform diagram showing a starting signal STV, a first dummy signal Cr(n+1), and a second dummy signal Cr(n+2).

As shown in FIG. 12, a gate driving circuit 100-2 includes a first dummy stage Dum1 and a second dummy stage Dum2 in addition to the stages SRC1 SRCn. The first dummy stage Dum1 outputs a first dummy signal Cr(n+1) through a carry terminal CR and an output signal through an output terminal OUT in response to a carry signal from an nth stage SRCn. Especially, the carry terminal CR of the first dummy stage Dum1 is connected to a first control terminal CT1 of the nth stage SRCn and an input terminal IN of the second dummy stage Dum2 to provide the first dummy signal Cr(n+1) to the first control terminal CT1 of the stage SRCn and the input terminal IN of the second dummy stage Dum2. Although not shown, the carry terminal CR of the first dummy stage Dum1 may be connected to a second control terminal CT2 of the stage SRC(n−1) to provide the first dummy signal Cr(n+1) to the second control terminal CT2 of the stage SRC(n−1).

In addition, the output terminal OUT of the first dummy stage Dum1 is connected to a control terminal of a last discharge transistor NT_D(n) linked with a last gate line GLn of a plurality of gate lines GL1 to GLn. Accordingly, the last discharge transistor NT_D(n) is turned on in response to the first dummy signal Cr(n+1) output through the output terminal OUT of the first dummy stage Dum1. The turned-on last discharge transistor NT_D(n) lowers the potential of the last gate line GLn to the first voltage Vss1.

The second dummy stage Dum2 outputs a second dummy signal Cr(n+2) through its carry terminal CR thereof in response to the first dummy signal Cr(n+1). The carry signal CR of the second dummy stage Dum2 is connected to a second control terminal CT2 of the stage SRCn and a first control terminal CT1 of the first dummy stage Dum1 to provide the second dummy signal Cr(n+2) to the second control terminal CT2 of the stage SRCn and the first control terminal CT1 of the first dummy stage Dum1. Accordingly, the first and second control terminals CT1 and CT2 of the stage SRCn receive the first and second dummy signals Cr(n+1) and Cr(n+2) from the first and second dummy stages Dum1 and Dum2, respectively, and a gate signal can be normally output to the last gate line GLn.

As shown in FIG. 12, a starting signal STV is applied to the second control terminal CT2 of the first dummy stage Dum1 and the first control terminal CT1 of the second dummy stage Dum2. Unlike the first dummy stage Dum1, the second dummy stage Dum2 does not have a second control terminal CT2. The second dummy stage Dum2 will be described below in more detail.

FIG. 13 shows that the starting signal STV is generated as a pulse, to maintain a high state for a duration of 1 H within a frame interval FRA1. A period of one frame FRA1 includes a pulse signal having a duration of 1 H for each of the stages SRC1 to SRCn, a first dummy stage Dum1, a second dummy stage Dum2, and a blank duration BLA1 after the second dummy signal Cr(n+2). During the blank duration BLA1, the first and second dummy signals Cr(n+1), Cr(n+2) are not output from the gate driving circuit 100-2.

The first and second dummy signals Cr(n+1), Cr(n+2) are sequentially generated, and are each maintained at a high state for the duration of 1 H. As shown in FIG. 11, the first and second dummy signals Cr(n+1), Cr(n+2) are used to control an operation of neighboring stages. However, as shown in FIG. 13, since the starting signal STV of a next frame is generated after the second dummy signal Cr(n+2) of a current frame has been generated, the starting signal STV may be used to control an operation of the first and second dummy stages Dum1 and Dum2.

Figure 14:
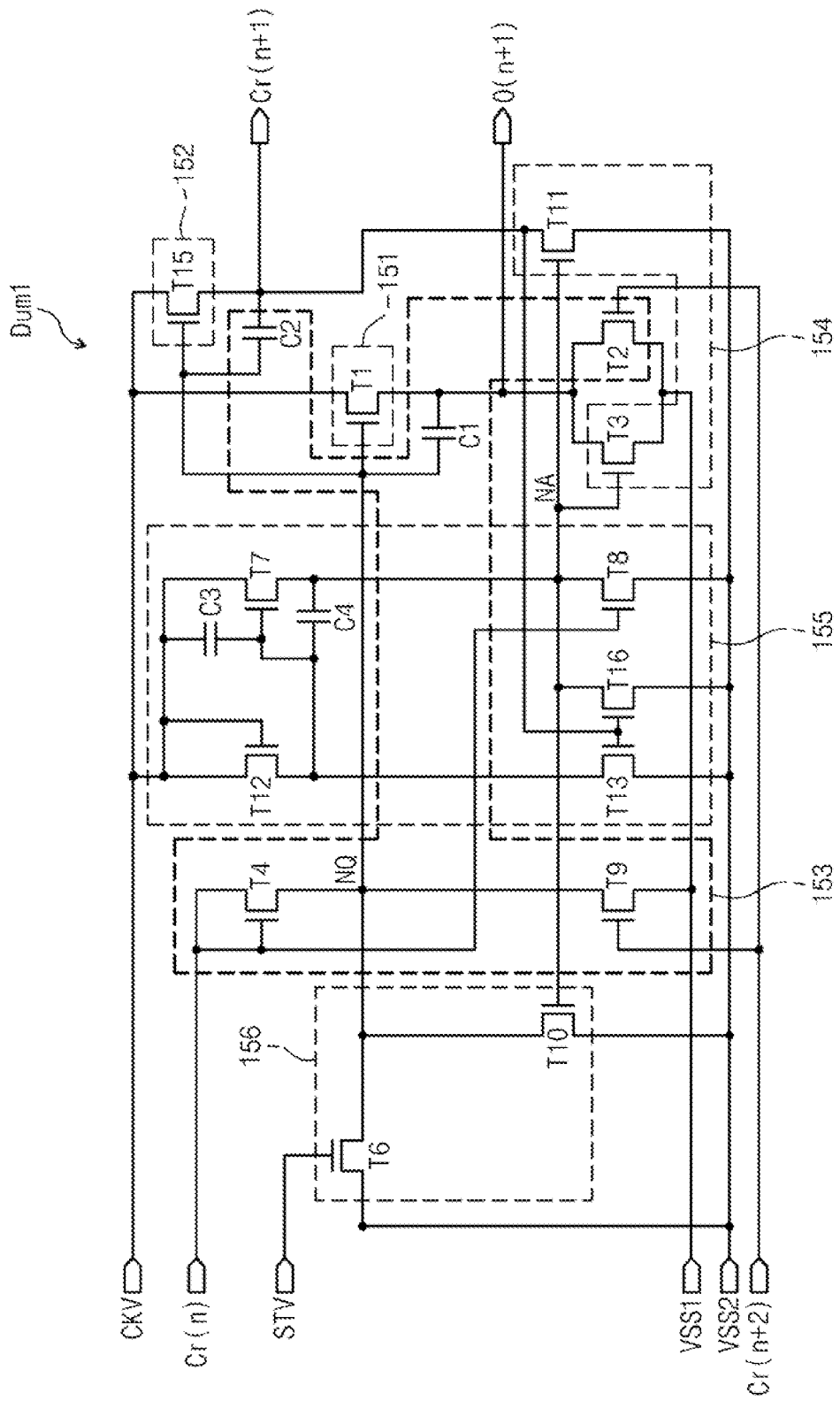
FIG. 14 is a circuit diagram showing the first dummy stage Dum1 of FIG. 12.

FIG. 14 is a circuit diagram showing the first dummy stage Dum1 of FIG. 12. As shown, the first dummy stage Dum1 includes a first transistor T1 (of a first circuit 151), a fifteenth transistor T15 (of a second circuit 152), a dummy controller 153, a dummy holding circuit 154, a dummy inverter circuit 155, and a stabilizing circuit 156. The first dummy stage Dum1 has substantially the same circuit configuration as that of each of the stages SRC1 to SRCn. However, the dummy stabilizing circuit 156 is different from the stabilizing circuit 116 of FIG. 6 in that it receives the starting signal STV.

Figure 15:
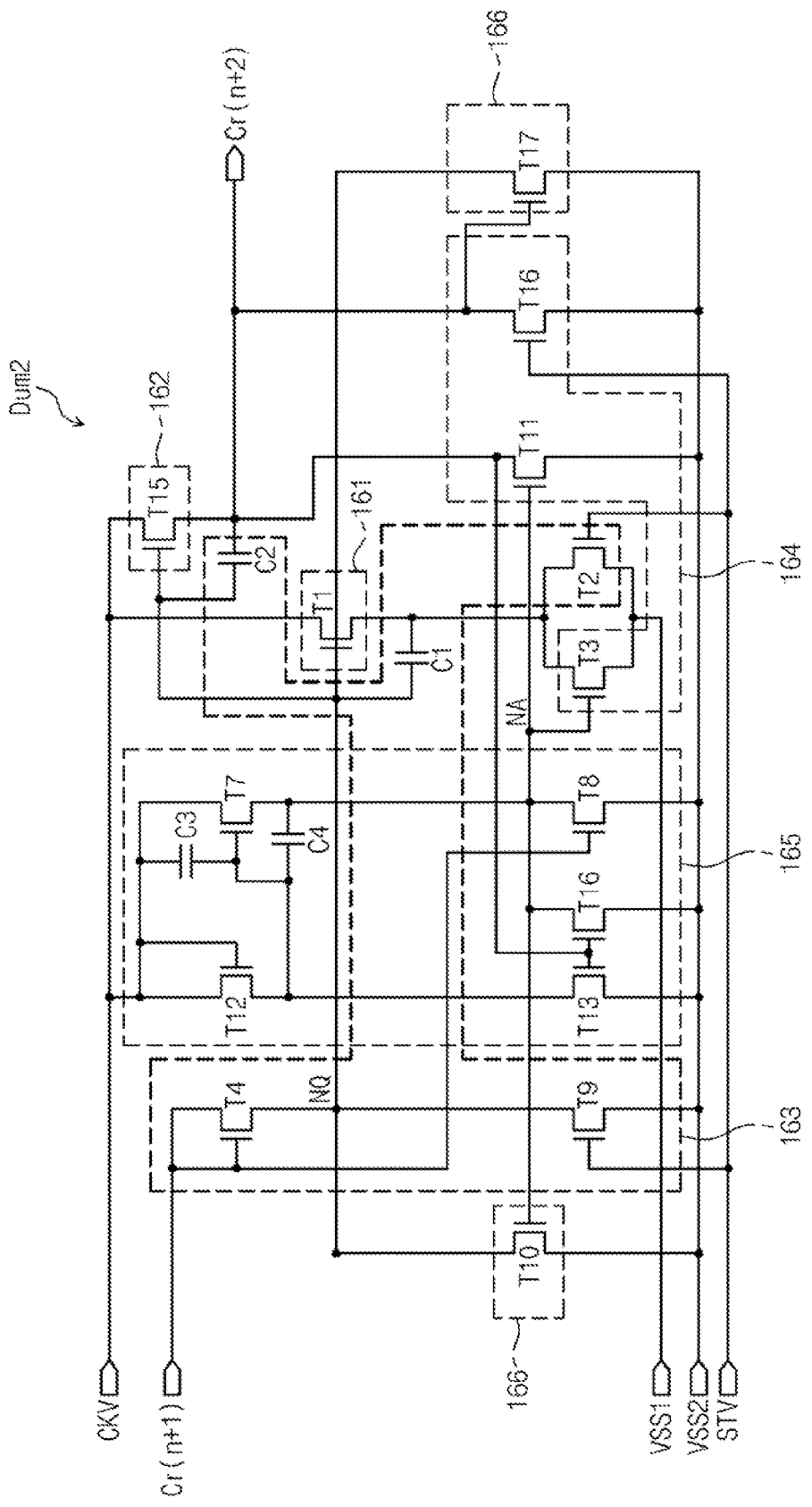
FIG. 15 is a circuit diagram showing an exemplary embodiment of the second dummy stage Dum2 of FIG. 12.

FIG. 15 is a circuit diagram showing an exemplary embodiment of the second dummy stage Dum2 of FIG. 12. As shown, the second dummy stage Dum2 includes a first transistor T1 (of a first circuit 161), a fifteenth transistor T15 (of a second circuit 162), a dummy controller circuit 163, a first dummy holding circuit 164, a second dummy holding circuit 165, and a stabilizing circuit 166. According to one embodiment, the second dummy stage Dum2 has a configuration similar to that of the third dummy stage Dum3 shown in FIG. 11.

Figure 16:
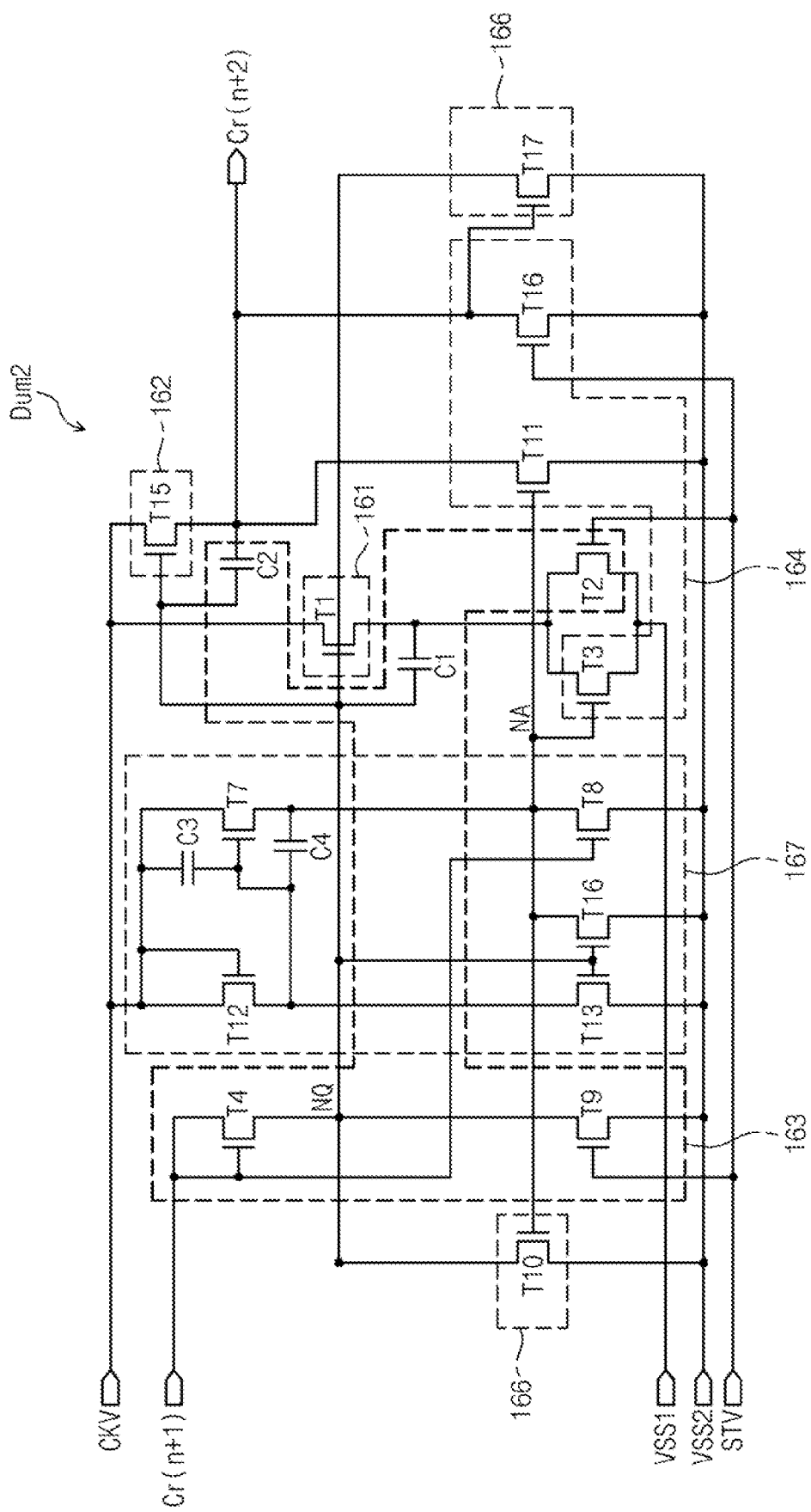
FIG. 16 is another embodiment of the second dummy stage Dum2 of FIG. 12.

FIG. 16 is another embodiment of the second dummy stage Dum2 shown in FIG. 12. This embodiment of the second dummy stage Dum2 includes the first transistor T1, the fifteenth transistor T15, a dummy controller circuit 163, a first dummy holding circuit 164, a second dummy holding circuit 167, and the stabilizing circuit 166.

The second dummy holding circuit 167 of this embodiment has a structure different from that of the second dummy holding circuit 165 of the second dummy stage Dum2 of FIG. 15. While the control terminal of the transistors T16 and T13 in FIG. 15 receive the second dummy signal Cr(n+2) from the transistor T15, the control terminals of T16 and T13 in the embodiment of FIG. 16 are connected to Node Q The potential at Node Q (NQ) of the second dummy stage Dum2 is stabilized to the second voltage Vss2 by transistors T10 and T17. Accordingly, an abnormal operation of the transistors T16 and T13 is prevented.

Figure 17:
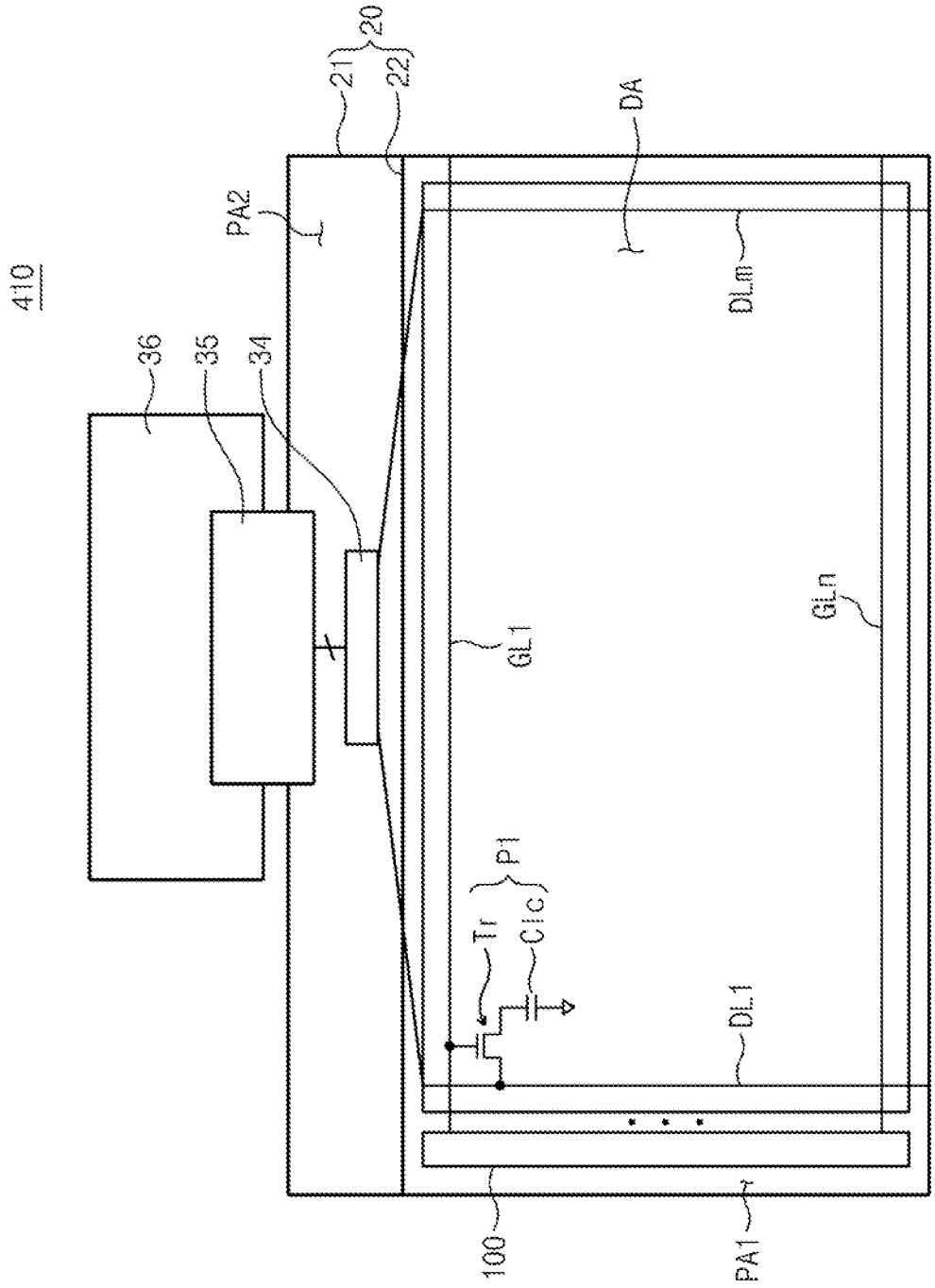
FIG. 17 is a plan view showing an alternative embodiment of the display apparatus.

FIG. 17 is a plan view showing an alternative embodiment of the display apparatus. The display apparatus 410 has a structure in which the data driving chips 30 of FIG. 1 are integrated into one driving chip 34. The first substrate 21 of the liquid crystal display panel 20 is divided into a first peripheral area PA1 and a second peripheral area PA2. The first peripheral area PA1 may include the gate driving circuit 100, and the second peripheral area may include the driving chip 34.

In the embodiment of FIG. 17, the display apparatus 410 includes a flexible printed circuit board 35 that connects the driving chip 34 with a printed circuit board 36. Accordingly, control signals from the printed circuit board 36 may be applied to the driving chip 34 and the gate driving circuit 100 through the flexible printed circuit board 35.

Although the foregoing invention has been described in some detail by way of illustration and examples for purposes of clarity and understanding, it will be apparent that modifications and alternative embodiments of the invention are contemplated. Hence, the exemplary embodiments provided herein are not limiting of the invention, the spirit and scope of which are defined by the foregoing teachings and appended claims.

What is claimed is:

1. A driving circuit including a shift register, the shift register having multiple stages, at least one of which is a stage SRC(i) comprising:
   a first output circuit that generates an output signal O(i) according to a potential at a Node Q;
   a second output circuit that generates a carry signal Cr(i) according to the potential at the Node Q;
   a controller circuit that controls the potential at the Node Q and the output signal O(i);
   a first holding circuit that maintains the output signal at a first voltage and maintains the carry signal at a second voltage lower than the first voltage in response to a predetermined potential state at a Node A; and
   a second holding circuit that controls a potential at the Node A, the second holding circuit including a first transistor that lowers the potential at the Node A in response to the carry signal Cr(i) by supplying the Node A with the second voltage.

2. The driving circuit of claim 1, wherein the first holding circuit comprises:
   a first holding transistor that connects the first output circuit to the first voltage; and
   a second holding transistor that connects the second output circuit to the second voltage.

3. The driving circuit of claim 2, wherein the first holding transistor and the second holding transistor of the first holding circuit have control terminals coupled to the Node A.

4. The driving circuit of claim 3, wherein the first holding transistor and the second holding transistor are turned off while the carry signal Cr(i) is being output, due to the first transistor in the second holding circuit being turned on.

5. The driving circuit of claim 1, wherein the second holding circuit comprises a sub-circuit that receives a clock signal CKV and outputs the clock signal CKV to the Node A.

6. The driving circuit of claim 5, wherein the second holding circuit further comprises a second transistor that connects the sub-circuit to the second voltage in response to the carry signal Cr(i).

7. The driving circuit of claim 6, wherein the second holding circuit comprises a third transistor that sets the potential at Node A to the second voltage in response to a carry signal Cr(i−1) from a previous stage SRC(i−1).

8. The driving circuit of claim 1, wherein the controller circuit comprises:
   a first control transistor that connects the first output circuit to the first voltage in response to a carry signal Cr(i+1) from a next stage SRC(i+1);
   a second control transistor that connects the Node Q to the first voltage Vss1 in response to the carry signal Cr(i+1) from the next stage SRC(i+1); and a third control transistor that passes a carry signal Cr(i−1) from a previous stage SRC(i−1) to the Node Q in response to the carry signal Cr(i−1).

9. A driving circuit comprising:
a first output circuit that generates an output signal according to a potential at a Node Q;
a second output circuit that generates a carry signal according to the potential at the Node Q;
a controller circuit that controls the potential at the Node Q and the output signal;
a first holding circuit that maintains the output signal at a first voltage and maintains the carry signal at a second voltage lower than the first voltage in response to a predetermined potential state at a Node A; and
a second holding circuit that controls a potential at the Node A, the second holding circuit including a first transistor that lowers the potential at the Node A in response to the carry signal by supplying the Node A with the second voltage; and
a stabilizing circuit having a stabilizing transistor that connects the Node Q to the second voltage in response to the predetermined potential state at the Node A.

10. The driving circuit of claim 1 further comprising a stabilizing circuit having a stabilizing transistor that connects the Node Q to the second voltage in response to a carry signal Cr(i+2) from stage SRC(i+2).

11. The driving circuit of claim 1, wherein the first output circuit comprises a first output transistor having a first terminal, a second terminal, and a control terminal.

12. The driving circuit of claim 1, wherein the second output circuit comprises a second output transistor having a first terminal, a second terminal, and a control terminal.

13. The driving circuit of claim 1, wherein the multiple stages comprise:
a first dummy stage that provides a first dummy signal Cr(n+1) to one of the non-dummy stages SRC(i);
a second dummy stage that provides a second dummy signal Cr(n+2) to the last non-dummy stage SRC(n) and the first dummy stage; and
a third dummy stage that provides a third dummy signal Cr(n+3) to the first and second dummy stages.

14. The driving circuit of claim 13, wherein the first dummy stage provides the first dummy signal to the second-to-last non-dummy stage SRC(n) in response to the second dummy signal Cr(n+2) and the third dummy signal Cr(n+3).

15. The driving circuit of claim 13, wherein the second dummy stage provides the second dummy signal Cr(n+2) to the last non-dummy stage SRC(n) according to the third dummy signal Cr(n+3).

16. The driving circuit of claim 13, wherein the second dummy stage provides the second dummy signal Cr(n+2) to the first dummy stage SRC(n+1) according to a starting signal STV.

17. The driving circuit of claim 13, wherein the third dummy stage provides the third dummy signal Cr(n+3) to the first and second dummy stages SRC(n+1), SRC(n+2) according to a starting signal STV.

18. The driving circuit of claim 13, wherein the third dummy stage comprises a second transistor that connects the third dummy signal Cr(n+3) to the second voltage Vss2 according to a starting signal STV.

19. The driving circuit of claim 18, wherein the third dummy stage further comprises a third transistor that connects the node Q to the second voltage Vss2 in response to the third dummy signal Cr(n+3).

20. The driving circuit of claim 1, wherein the multiple stages comprise:
a first dummy stage Dum1 providing a first dummy signal Cr(n+1) and a dummy output signal O(n+1) in response to a carry signal Cr(n) from the last non-dummy stage SRC(n).

21. The driving circuit of claim 20, wherein the multiple stages further comprise:
a second dummy stage Dum2 outputting a second dummy signal Cr(n+2) to the last non-dummy stage SRC(n) and the first dummy stage Dum1 in response to the first dummy signal Cr(n+1).

22. The driving circuit of claim 21, wherein the second dummy stage Dum2 comprises:
a second dummy holding circuit having a sub-circuit that receives a clock signal CKV and outputs the clock signal CKV to the Node A; and
a second transistor that connects the sub-circuit to a second voltage Vss2 in response to a high potential at the Node Q.

23. A display apparatus comprising:
a display panel including gate lines and data lines;
a gate driver circuit including a shift register, the shift register having multiple stages, at least one of which is a stage SRC(i) having:
a first circuit that generates an output signal O(i) and transmits it to one of the gate lines according to a potential at a Node Q;
a second circuit that generates a carry signal Cr(i) according to the potential at the Node Q;
a controller circuit that controls the potential at the Node Q and the output signal O(i);
a first holding circuit that maintains the output signal at a first voltage and maintains the carry signal at a second voltage lower than the first voltage in response to a predetermined potential state at a Node A; and
a second holding circuit that controls the potential at the Node A, the second holding circuit including a first transistor that lowers the potential at the Node A in response to the carry signal Cr(i) by supplying the Node A with the second voltage; and
a data driver chip outputting data voltages to the data lines.

24. The display apparatus of claim 23, wherein the multiple stages of the gate driver comprise:
a first dummy stage that provides a first dummy signal Cr(n+1) to one of the non-dummy stages SRC(i);
a second dummy stage that provides a second dummy signal Cr(n+2) to the last non-dummy stage SRC(n) and the first dummy stage; and
a third dummy stage that provides a third dummy signal Cr(n+3) to the first and second dummy stages.

25. The display apparatus of claim 23, wherein the multiple stages of the gate driver comprise:
a first dummy stage Dum1 providing a first dummy signal Cr(n+1) and a dummy output signal O(n+1) in response to a carry signal Cr(n) from the last non-dummy stage SRC(n); and
a second dummy stage Dum2 outputting a second dummy signal Cr(n+2) to the last non-dummy stage SRC(n) and the first dummy stage Dum1 in response to the first dummy signal Cr(n+1).

* * * * *